United States Patent
Aoshima et al.

(10) Patent No.: US 6,403,283 B1
(45) Date of Patent: *Jun. 11, 2002

(54) NEGATIVE WORKING IMAGE RECORDING MATERIAL

(75) Inventors: Keitaro Aoshima; Katsuji Kitatani; Fumikazu Kobayashi, all of Shizuoka (JP)

(73) Assignee: Fuji Photo Film Co., Ltd., Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/811,932

(22) Filed: Mar. 5, 1997

(30) Foreign Application Priority Data

Mar. 11, 1996 (JP) .............................................. 8-053035
Jul. 17, 1996 (JP) .............................................. 8-187943

(51) Int. Cl.[7] .............................. G03C 1/77; G03F 7/038

(52) U.S. Cl. ................................. 430/278.1; 430/270.1; 430/920; 430/921; 430/944

(58) Field of Search ............................. 430/270.1, 944, 430/920, 921, 325, 278.1; 522/50, 57, 59, 71, 75, 109, 146, 904

(56) References Cited

U.S. PATENT DOCUMENTS 5,238,781 A * 8/1993 Schadeli ................... 430/270.1
5,304,456 A * 4/1994 Ueda et al. ............... 430/270.1
5,340,699 A   8/1994 Haley et al. ................ 430/302

(List continued on next page.)

FOREIGN PATENT DOCUMENTS

EP     497342    8/1992
EP     510443    10/1992
EP     568993    11/1993

(List continued on next page.)

OTHER PUBLICATIONS

Japanese Patent Office Computer English–Language Translation of JP 8–276558 (Pub Oct. 1996).*
Grant, R. et al. eds. *Grant & Hackh's Chemical Dictionary*, 5th ed., McGraw–Hill Book Company, NY (1987), p. 181.*
Dye Catalog of Nippon Kankoh–Shikiso Kenkyusho Co., Ltd (Jul. 3, 1994) pp. 1–48.*
Derwent Abstract AN: 90–159296 of JP 02–100–053 (Pub 4/90).

*Primary Examiner*—Janis L. Dote
(74) *Attorney, Agent, or Firm*—Sughrue Mion, PLLC

(57) ABSTRACT

A negative working image recording material which comprises the following four components (A) to (D):

(A) at least one of compounds represented by following general formulas (I) to (V), or at least one of polymers obtained by radical polymerization using at least one of monomers represented by following general formulas (VI) to (X):

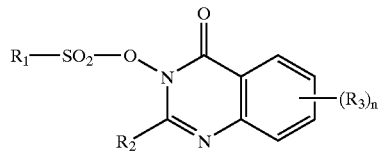

(I)

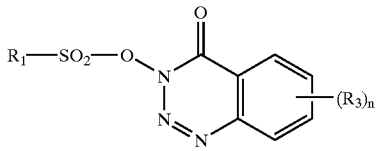

(II)

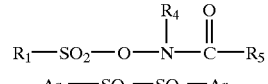

(III)

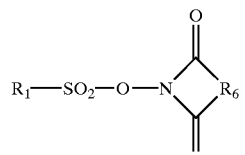

(IV)
(V)

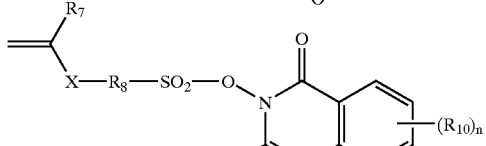

(VI)

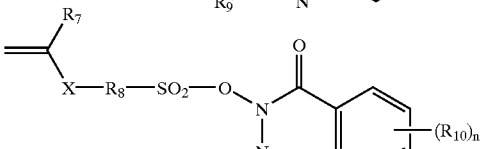

(VII)

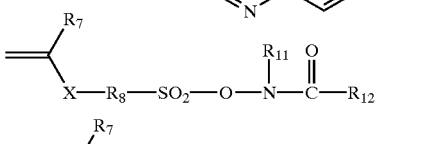

(VIII)

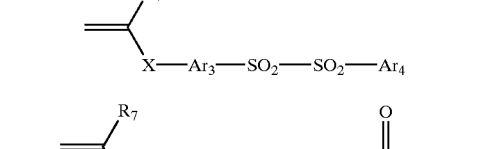

(IX)

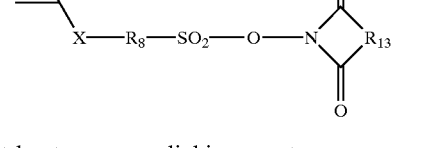

(X)

(B) at least one cross-linking agent;
(C) at least one infrared absorbing agent;
(D) at least one novolak resin.

14 Claims, No Drawings

U.S. PATENT DOCUMENTS

| | | | | |
|---|---|---|---|---|
| 5,372,907 A | * | 12/1994 | Haley et al. | 430/270.1 |
| 5,466,557 A | | 11/1995 | Haley | 430/278 |
| 5,488,182 A | * | 1/1996 | Kobayashi et al. | 568/660 |
| 5,491,046 A | * | 2/1996 | DeBoer et al. | 430/302 |
| 5,527,659 A | * | 6/1996 | Yamaoka | 430/179 |
| 5,643,700 A | * | 7/1997 | Otsuka | 430/30 |
| 5,658,708 A | * | 8/1997 | Kondo | 430/288.1 |
| 5,814,431 A | * | 9/1998 | Nagasaka et al. | 430/270.1 |
| 6,132,935 A | * | 10/2000 | Kobayashi et al. | 430/270.1 |

FOREIGN PATENT DOCUMENTS

| | | |
|---|---|---|
| EP | 672954 | 9/1995 |
| JP | 7-271029 | 10/1995 |
| JP | 8-276558 | * 10/1996 |

* cited by examiner

NEGATIVE WORKING IMAGE RECORDING MATERIAL

BACKGROUND OF THE INVENTION

1. Field of the Invention

The present invention relates to an image recording material which can be used as a planographic printing plate material. More particularly, the present invention relates to a planographic printing plate material which is usable for so-called direct plate making and which is capable of directly making a printing plate using infrared laser based on digital signals outputted from computer or the like.

2. Description of the Related Art

As systems of direct plate making from digital data of computer or the like, there have hitherto been proposed (1) system using an electrophotographic method, (2) system using photopolymerization wherein exposure is carried out using laser which emits blue or green light, (3) system by laminating a silver salt layer on a photosensitive resin, and (4) system by a silver salt diffusion transfer method and the like.

However, in a system using an electrophotographic method (1) above has complicated image formation processes such as charge, exposure, development and the like and, therefore, an apparatus therefor becomes sophisticated and large. In a system using photopolymerization (2) above, since the printing plate is highly sensitive to blue or green light, it becomes difficult to handle in an illuminated room. In methods (3) and (4), since a silver salt is used, those methods have a disadvantage that process such as development and the like becomes complicated and a waste solution naturally contains silver.

In recent years, laser technologies have been remarkably developed. In particular, high output and small-sized solid-state laser and semiconductor laser emitting infrared ray of wavelength from 760 nm to 1200 nm can be easily available. These lasers are very useful as a light source for recording when plate making is performed from digital data of computer and the like. However, since many of practically useful photosensitive recording materials are sensitive to visible light having wavelength of not greater than 760 nm, image recording can not be carried out with these infrared lasers. For this reason, there is a need for a material which is recordable with infrared laser.

One example of an image recording material which is recordable with infrared laser is a recording material described in Japanese Patent Application Laid-Open (JP-A) No. 7-20629, comprising an onium salt, a resol resin, a novolak resin and an infrared absorbing agent. Japanese Patent Application Laid-Open (JP-A) No. 7-271029 describes a recording material comprising s-triazine substituted with haloalkyl, a resol resin and a novolak resin, and an infrared light absorbing agent. However, these image recording materials have a problem that stain is produced on a non-image part when they are stored for a long period of time at an elevated temperature, followed by image formation and printing.

SUMMARY OF THE INVENTION

One object of the present invention is to provide a negative working planographic printing plate with which plate making for printing can be performed from digital data of computer and the like by using solid-state laser or semiconductor laser emitting infrared ray, and which is excellent in storability, in particular, at an elevated temperature. This object and other objects as well as advantages of the present invention will become apparent with reference to the description below.

The present inventors gave attention to components of a negative working imaging recording material and studied them extensively. As a result, it has been found that the above objects can be attained by using a negative working image recording material comprising the following components (A) to (D), so that the present invention was completed.

The present invention relates to a negative working image recording material which comprises the following four components (A) to (D):

(A) at least one of compounds represented by following general formulas (I) to (V), or at least one of polymers obtained by radical polymerization using at least one of monomers represented by following general formulas (VI) to (X):

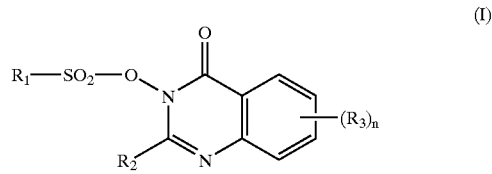

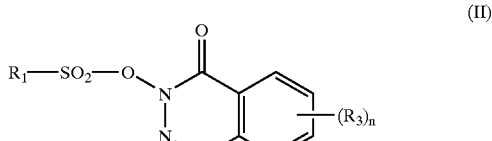

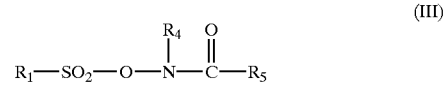

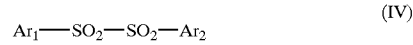

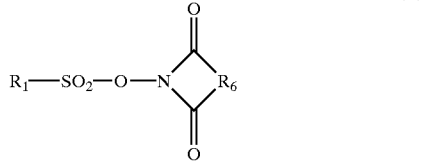

wherein $R_1$, $R_2$, $R_4$ and $R_5$ each represent a hydrocarbon group which has not more than 20 carbon atoms and which may be substituted; $R_3$ represents a halogen atom, or a hydrocarbon group which has not more than 10 carbon atoms and which may be substituted, or an alkoxy group which has not more than 10 carbon atoms and which may be substituted; $Ar_1$ and $Ar_2$ each represent an aryl group which has not more than 20 carbon atoms and which may be substituted; $R_6$ represents a divalent hydrocarbon group which has not more than 20 carbon atoms and which may be substituted; and n represents an integer of 0 to 4;

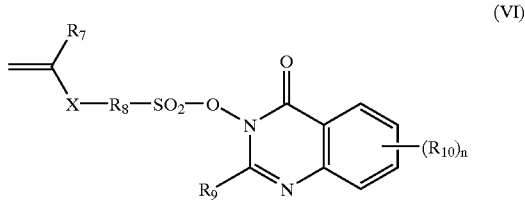

-continued

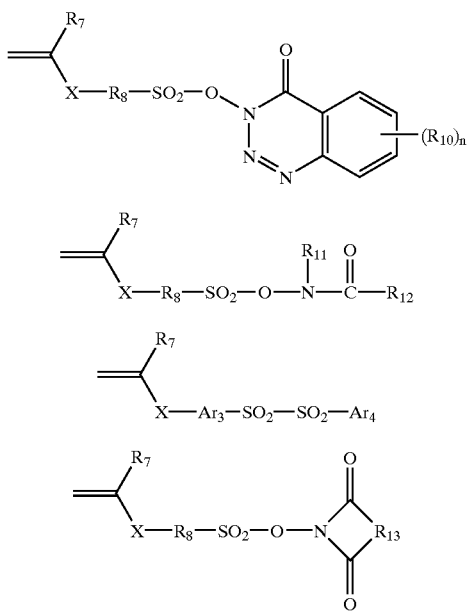

wherein $R_7$ represents a hydrogen atom, or a hydrocarbon group which has not more than 20 carbon atoms and which may be substituted; $R_8$ represents a single bond, or a divalent hydrocarbon group which has not more than 20 carbon atoms and which may be substituted; $R_9$, $R_{11}$ and $R_{12}$ each represent a hydrocarbon group which has not more than 20 carbon atoms and which may be substituted; $Ar_3$ and $Ar_4$ each represent an aryl group which has not more than 20 carbon atoms and which may be substituted; $R_{10}$ represents a halogen atom, or a hydrocarbon group which has not more than 10 carbon atoms and which may be substituted or an alkoxy group which has not more than 10 carbon atoms and which may be substituted; $R_{13}$ represents a divalent hydrocarbon group which has not more than 20 carbon atoms and which may be substituted; n represents an integer of 0 to 4; X represents a single bond, —CO—O— or —CO—NR$_{14}$—; $R_{14}$ represents a hydrogen atom, or a hydrocarbon group which has not more than 20 carbon atoms and which may be substituted;

(B) at least one cross-linking agent;
(C) at least one infrared absorbing agent;
(D) at least one novolak resin.

DETAILED DESCRIPTION OF THE INVENTION

The present invention is explained below in detail.

[Components (A) represented by the general formulas (I) to (V)]

In the above general formulas, $R_1$, $R_2$, $R_4$ and $R_5$ each may be the same or different and represent a hydrocarbon group which has not more than 20 carbon atoms and which may be substituted.

Examples of the hydrocarbon group are an alkyl group such as methyl group, ethyl group, n-propyl group, i-propyl group, n-butyl group, sec-butyl group, t-butyl group, hexyl group, cyclohexyl group, octyl group, 2-ethylhexyl group, undecyl group, dodecyl group and the like; an alkenyl group such as allyl group, vinyl group, 1-methylvinyl group, 2-phenylvinyl group and the like; an aralkyl group such as benzyl group and the like; and an aryl group such as phenyl group, tolyl group, xylyl group, cumenyl group, mesityl group, dodecylphenyl group, phenylphenyl group, naphthyl group and the like.

These hydrocarbon groups may have substituent(s) such as a halogen atom, an alkoxy group, a nitro group, a cyano group, a carboxy group and the like. Examples of the hydrocarbon group having the substituent(s) are trifluoromethyl group, chloroethyl group, 2-methoxyethyl group, fluorophenyl group, chlorophenyl group, bromophenyl group, iodophenyl group, methoxyphenyl group, phenoxyphenyl group, methoxyphenylvinyl group, nitrophenyl group, cyanophenyl group, carboxyphenyl group and the like.

$R_3$ represents a halogen atom, a hydrocarbon group, which has not more than 10 carbon atoms, and which may be substituted, (such as an alkyl group, an alkenyl group, an aralkyl group, an aryl group) or an alkoxy group which has not more than 10 carbon atoms.

More particularly, examples thereof are a halogen atom such as fluorine, chlorine, bromine and iodine; a hydrocarbon group such as methyl group, ethyl group, n-propyl group, i-propyl group, allyl group, n-butyl group, sec-butyl group, t-butyl group, hexyl group, cyclohexyl group, benzyl group, phenyl group, tolyl group and the like; a hydrocarbon group which has substituent(s), such as 2-methoxyethyl group, fluorophenyl group, chlorophenyl group, bromophenyl group, iodophenyl group, methoxyphenyl group and the like; and an alkoxy group such as methoxy group, ethoxy group and the like.

Alternatively, two $R_3$ groups may be bonded each other to form a condensed ring.

$Ar_1$ and $Ar_2$ may be the same or different and each represent an aryl group which has not more than 20 carbon atoms and which may be substituted.

More particularly, examples thereof are phenyl group, tolyl group, xylyl group, cumenyl group, mesityl group, dodecylphenyl group, phenylphenyl group, naphthyl group, fluorophenyl group, chlorophenyl group, bromophenyl group, iodophenyl group, chloronaphthyl group, methoxyphenyl group, phenoxyphenyl group, ethoxynaphthyl group, nitrophenyl group, cyanophenyl group, carboxyphenyl group, nitronaphthyl group and the like.

$R_6$ represents a hydrocarbon group, which has not more than 20 carbon atoms, and which may be substituted (e.g. an alkylene group, an alkenylene group, an aralkylene group and an arylene group).

More particularly, examples thereof are ethynylene group, 1,2-cyclohexenylene group, 1,2-phenylene group, 4-chloro-1,2-phenylene group, 4-nitro-1,2-phenylene group, 4-methyl-1,2-phenylene group, 4-methoxy-1,2-phenylene group, 4-carboxy-1,2-phenylene group, 1,8-naphthalenylene group and the like.

n represents an integer of 0 to 4. When n is 0, $R_3$ is not present, i.e., group —($R_3$)$_n$ represents a hydrogen atom.

Preferable compounds among those represented by the general formulas (I) to (V) are shown below.

These compounds can be prepared by a method described, for example, in Japanese Patent Application Laid-Open (JP-A) Nos. 2-100054 and 2-100055.

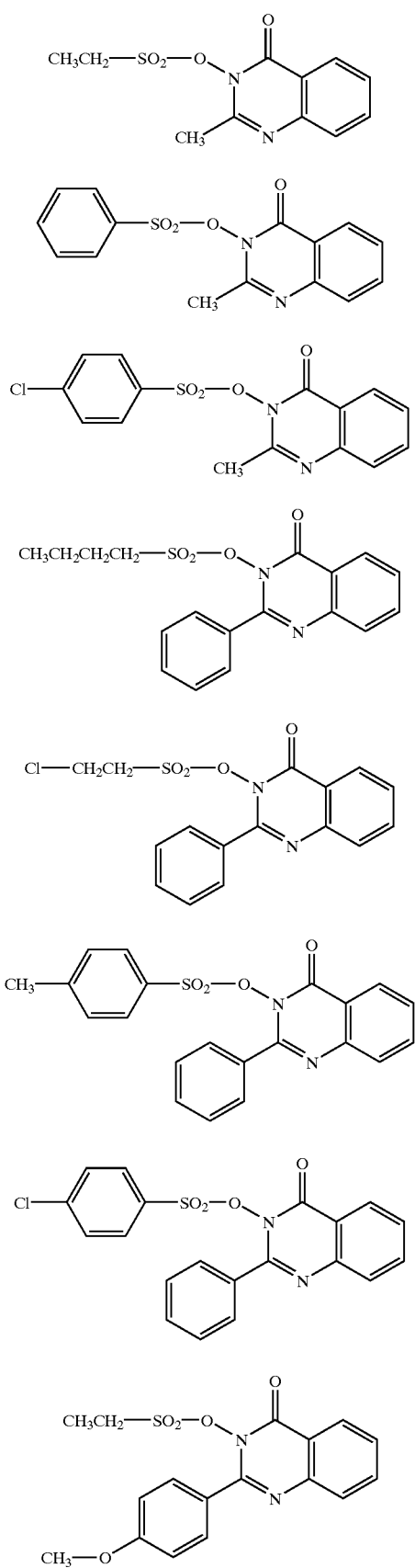
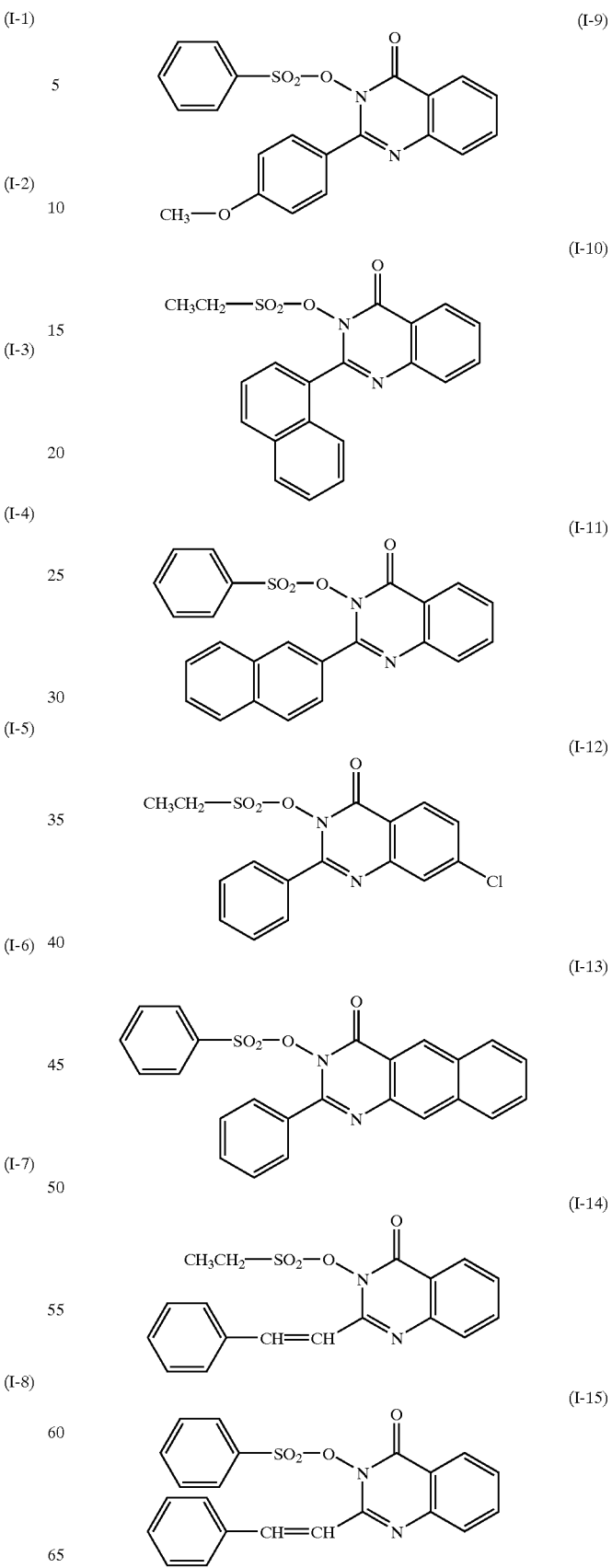

-continued
(I-16)
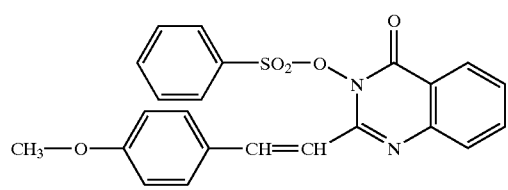
(II-1)
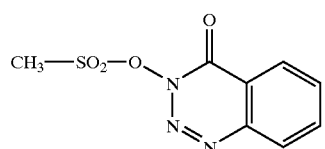
(II-2)
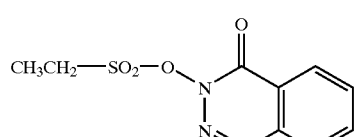
(II-3)
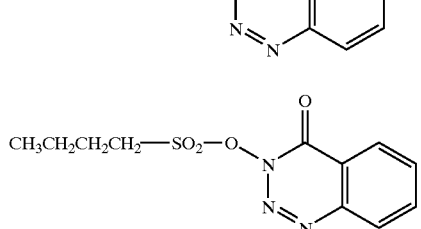
(II-4)
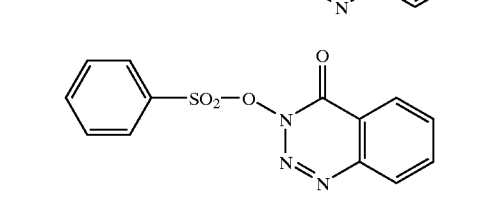
(II-5)
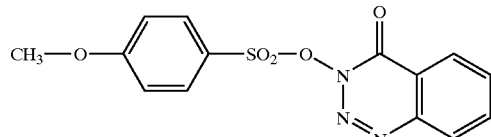
(II-6)
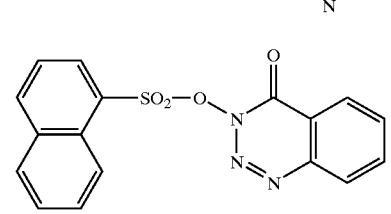
(III-1)
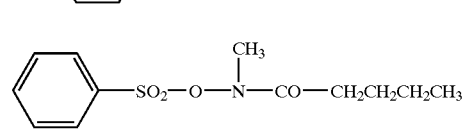
(III-2)
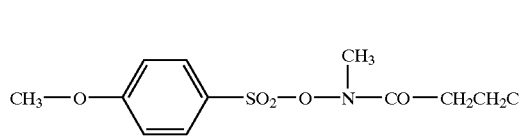
(III-3)
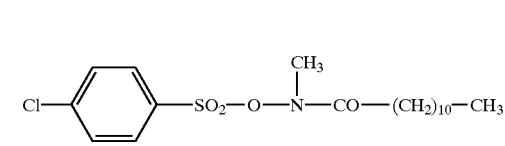
-continued
(III-4)
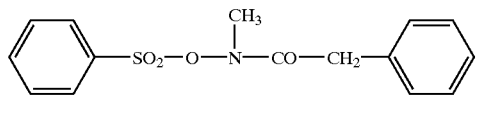
(III-5)
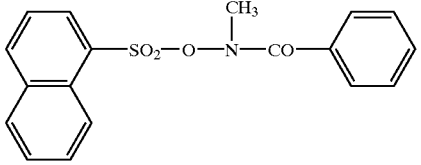
(III-6)
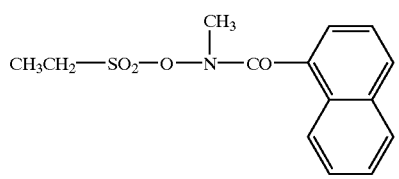
(III-7)
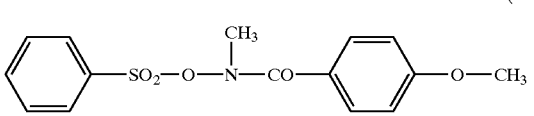
(III-8)
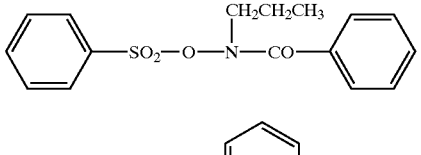
(III-9)
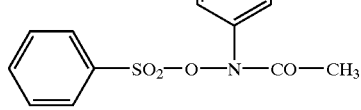
(III-10)
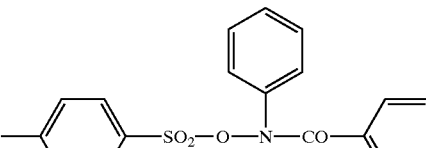
(III-11)
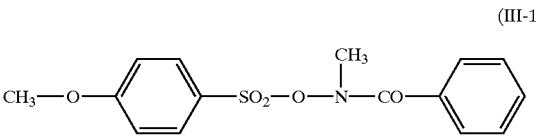
(III-12)
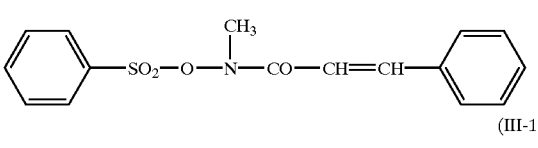
(III-13)
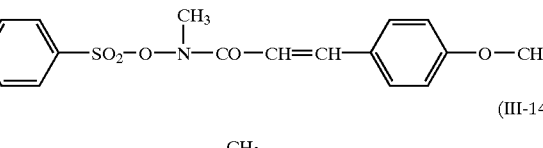
(III-14)
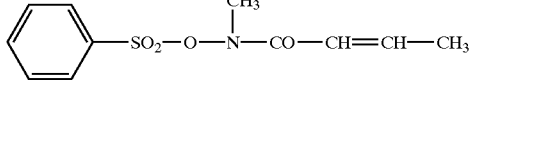

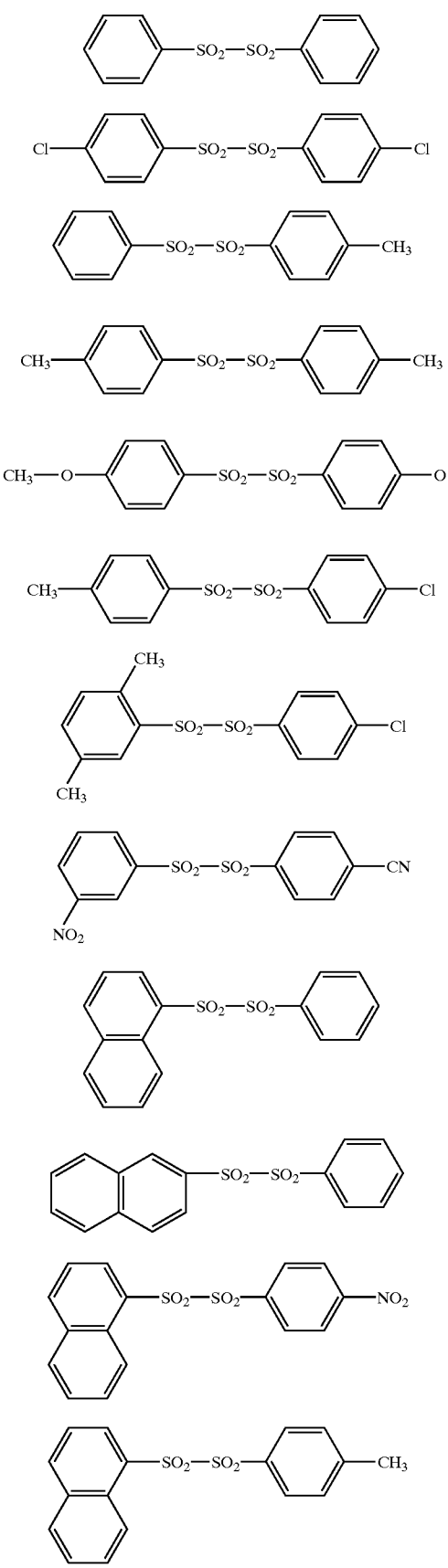
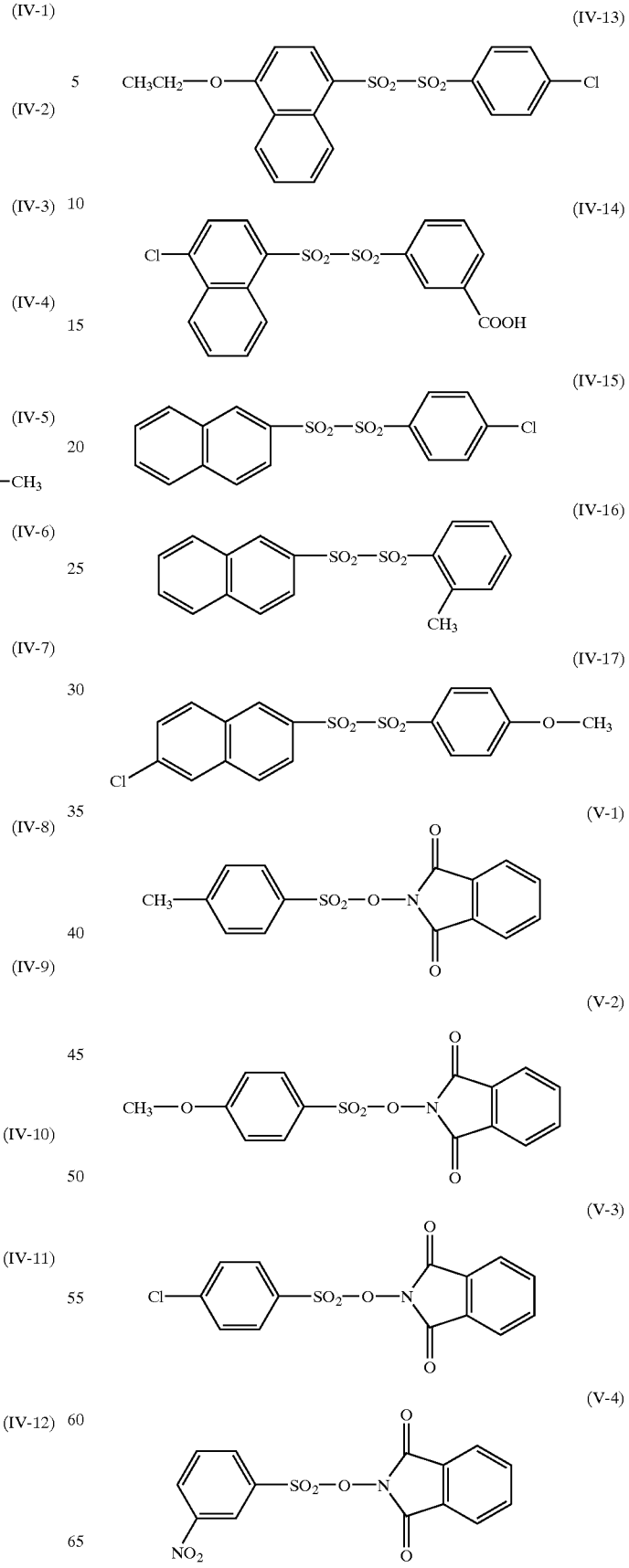

(V-5) 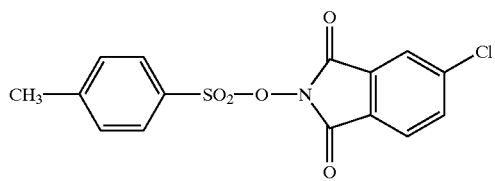

(V-6) 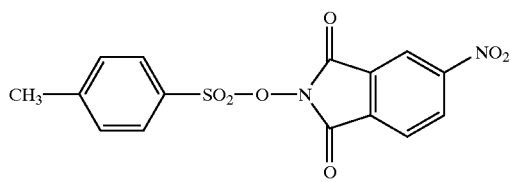

(V-7) 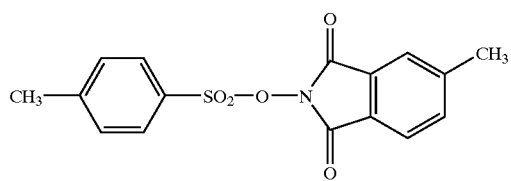

(V-8) 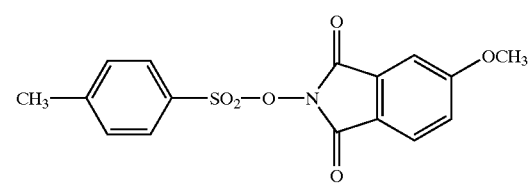

(V-9) 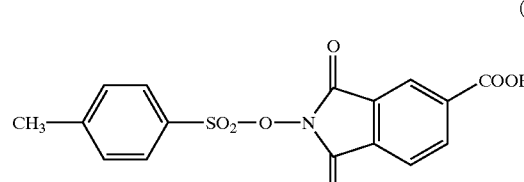

(V-10) 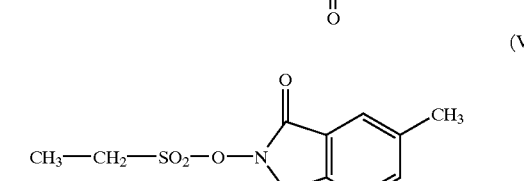

(V-11) 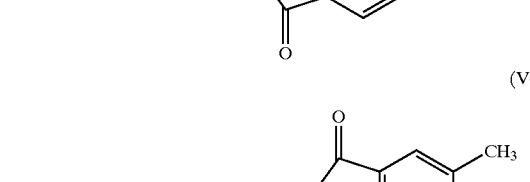

(V-12) 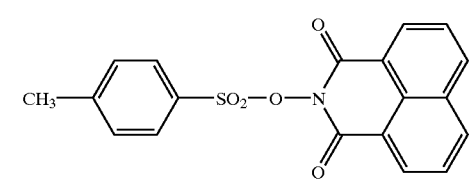

(V-13) 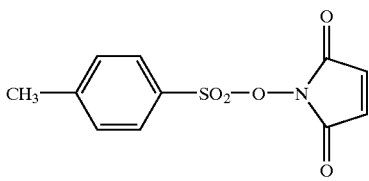

(V-14) 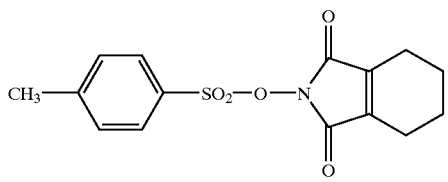

These compounds or the polymer described hereinafter are added in the image recording material in an amount of 0.01 to 50% by weight, preferably 0.1 to 25% by weight, and more preferably 0.5 to 15% by weight based on the total weight of solid components in the image recording material. When the amount of addition of these compound is less than 0.01% by weight, an image can not be obtained. When the amount exceeds 50% by weight, stains are produced in a non-image part of a print. These compounds may be used alone or in combination of two or more ones.

[Components (A) shown by polymer having constituent unit represented by general formulas (VI) to (X)]

In the above general formulas, $R_7$ represents hydrogen atom, or hydrocarbon group which has not more than 20 carbon atoms, and which may be substituted, such as an alkyl group, an alkenyl group, an aralkyl group and an aryl group. These hydrocarbon groups may have substituents such as a halogen atom, an alkoxy group, a nitro group, a cyano group, a carboxy group and the like.

More particularly, examples thereof are hydrogen atom, methyl group, ethyl group, carboxymethyl group, chloromethyl group, phenyl group and the like, preferably hydrogen atom and methyl group.

$R_8$ represents a single bond, or a divalent hydrocarbon group which has not more than 20 carbon atoms and which may be substituted, such as an alkylene group, an alkenylene group, an aralkylene group and an arylene group.

Examples of the divalent a hydrocarbon group may be included methylene group, ethylene group, propylene group, methylethylene group, butylene group, methylpropylene group, dimethylethylene group, pentylene group, hexylene group, octylene group, phenylene group, naphthylene group and the like. These hydrocarbon groups may have substituents such as a halogen atom, an alkoxy group, a nitro group, a cyano group, a carboxy group, and the like.

Preferable $R_8$ is a single bond, or a hydrocarbon group which has not more than 12 carbon atoms and which may be substituted.

$R_9$, $R_{11}$ and $R_{12}$ each represent a hydrocarbon group which has not more than 20 carbon atoms and which may be substituted.

Examples of the hydrocarbon group are an alkyl group such as methyl group, ethyl group, n-propyl group, i-propyl group, n-butyl group, sec-butyl group, t-butyl group, hexyl group, cyclohexyl group, octyl group, 2-ethylhexyl group, dodecyl group and the like; an alkenyl group such as vinyl group, allyl group, 1-methylvinyl group, 2-phenylvinyl group and the like; an aralkyl group such as benzyl group and the like; and an aryl group such as phenyl group, tolyl group, xylyl group, cumenyl group, mesityl group, dodecylphenyl group, phenylphenyl group, naphthyl group and the like.

These hydrocarbon groups may have substituents such as a halogen atom, an alkoxy group, a nitro group, a cyano group, a carboxy group and the like. Examples of the hydrocarbon group having the substituent(s) are trifluoromethyl group, 2-methoxyethyl group, fluorophenyl group, chlorophenyl group, bromophenyl group, iodophenyl group, methoxyphenyl group, phenoxyphenyl group, nitrophenyl group, cyanophenyl group, carboxyphenyl group and the like.

Preferable $R_9$, $R_{11}$ and $R_{12}$ each are a hydrocarbon group which has not more than 12 carbon atoms and which may be substituted.

$Ar_3$ and $Ar_4$ each represent an aryl group which has not more than 20 carbon atoms and which may be substituted. These aryl groups may have substituents such as a halogen atom, an alkoxy group, a nitro group, a cyano group, a carboxy group and the like.

More particularly, examples thereof are phenyl group, tolyl group, xylyl group, cumenyl group, mesityl group, dodecylphenyl group, phenylphenyl group, naphthyl group, fluorophenyl group, chlorophenyl group, bromophenyl group, iodophenyl group, methoxyphenyl group, phenoxyphenyl group, nitrophenyl group, cyanophenyl group, carboxyphenyl group, nitronaphthyl group and the like. Preferable $Ar_3$ and $Ar_4$ are an aryl group which has not more than 12 carbon atoms and which may be substituted.

$R_{10}$ represents a halogen atom, or a hydrocarbon group which has not more than 10 carbon atoms and which may be substituted, (such as an alkyl group, an alkenyl group, an aralkyl group and an aryl group) or an alkoxy group which has not more than 10 carbon atoms.

More particularly, examples thereof are a halogen atom such as fluorine, chlorine, bromine and iodine; a hydrocarbon group such as methyl group, ethyl group, n-propyl group, i-propyl group, allyl group, n-butyl group, sec-butyl group, t-butyl group, hexyl group, cyclohexyl group, benzyl group, phenyl group, tolyl group and the like; a hydrocarbon group which has substituent (s), such as 2-methoxyethyl group, fluorophenyl group, chlorophenyl group, bromophenyl group, iodophenyl group, methoxyphenyl group and the like; and an alkoxy group such as methoxy group, ethoxy group and the like.

Alternatively, two $R_{10}$ groups may be bounded each other to form a condensed ring.

$R_{13}$ represents a divalent hydrocarbon group which has not more than 20 carbon atoms and which may be substituted, (e.g. an alkylene group, an alkenylene group, an aralkylene group and an arylene group).

More particularly, examples thereof are 1,2-cyclohexenylene group, 1,2-phenylene group, 4-chloro-1,2-phenylene group, 4-nitro-1,2-phenylene group, 4-methyl-1,2-phenylene group, 4-methoxy-1,2-phenylene group, 4-carboxy-1,2-phenylene group, 1,8-naphthalenylene group and the like.

n represents an integer of 0 to 4.

X represents a single bond, —CO—O or —CO—$NR_{14}$—. $R_{14}$ represents a hydrogen atom, or a hydrocarbon group which may be substituted with substituent(s) (such as a halogen atom, an alkoxy group, a nitro group, a cyano group, a carboxy group and the like) and which has not more than 20 carbon atoms (such as an alkyl group, an alkenyl group, an aralkyl group and an aryl group). Preferable $R_{14}$ is a hydrogen atom, or a hydrocarbon group which has not more than 12 carbon atoms such as methyl group, ethyl group, phenyl group and the like.

Among monomers represented by the general formulas (VI) to (X), preferable examples are shown below.

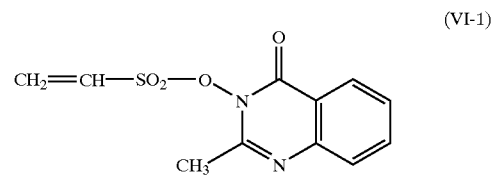
(VI-1)

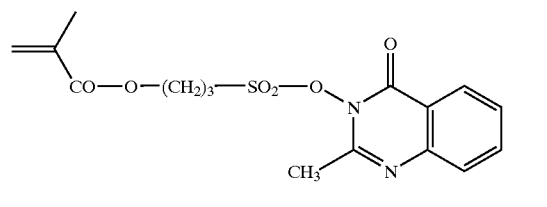
(VI-2)

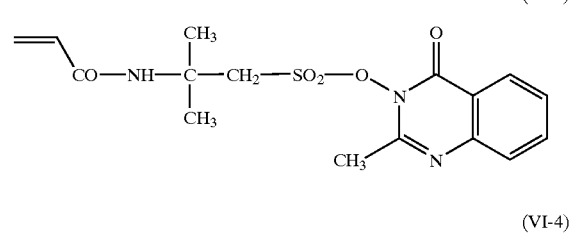
(VI-3)

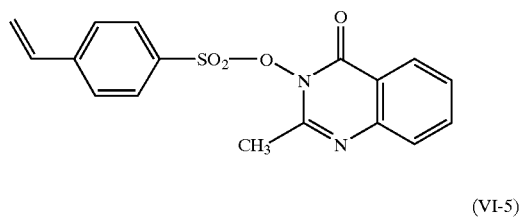
(VI-4)

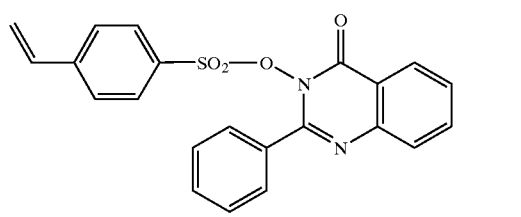
(VI-5)

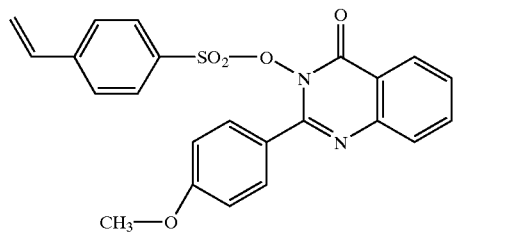
(VI-6)

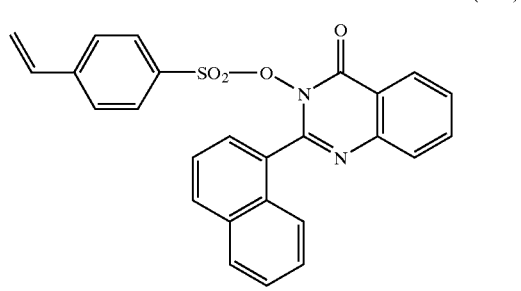
(VI-7)

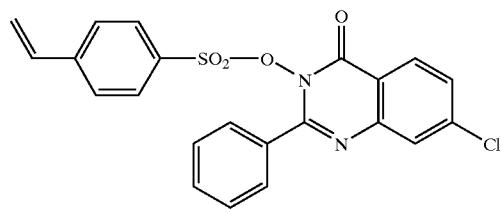
(VI-8)
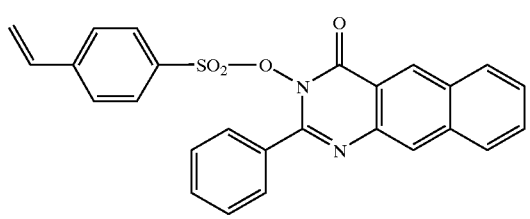
(VI-9)
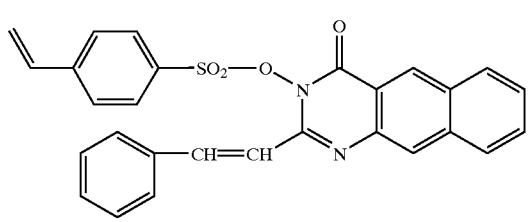
(VI-10)
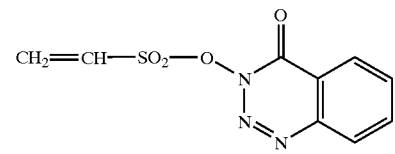
(VII-1)
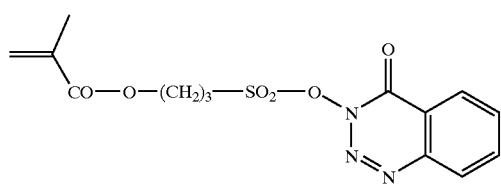
(VII-2)
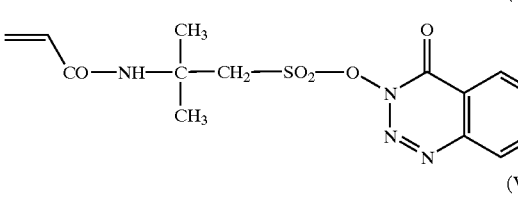
(VII-3)
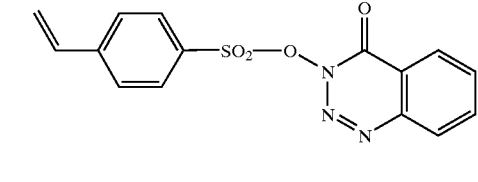
(VII-4)
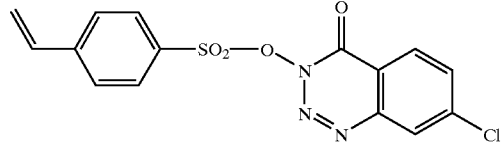
(VII-5)
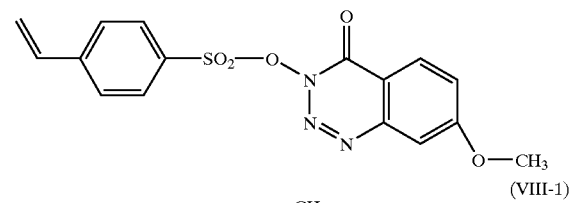
(VII-6)
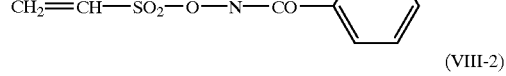
(VIII-1)
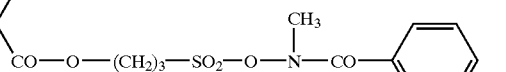
(VIII-2)
(VIII-3)
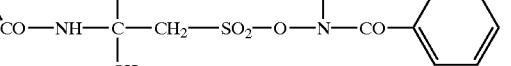
(VIII-4)
(VIII-5)
(VIII-6)
(VIII-7)
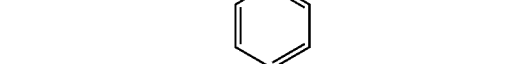
(VIII-8)
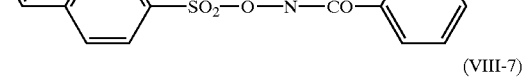
(IX-1)
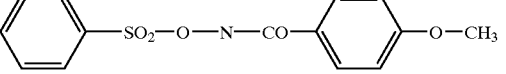
(IX-2)

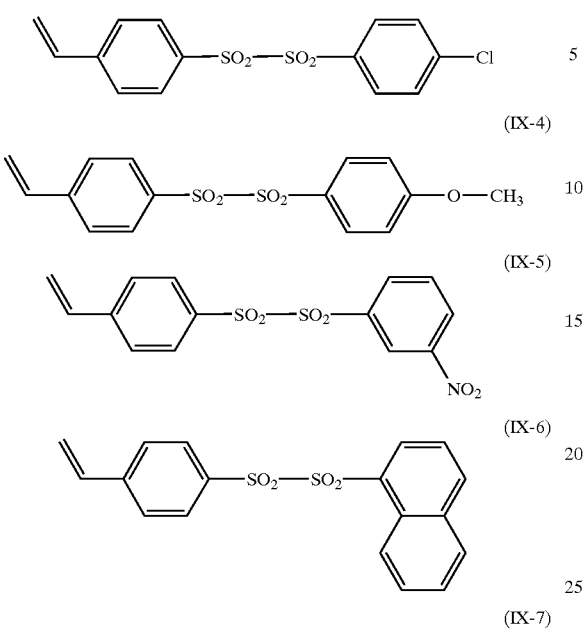
(IX-3)
(IX-4)
(IX-5)
(IX-6)
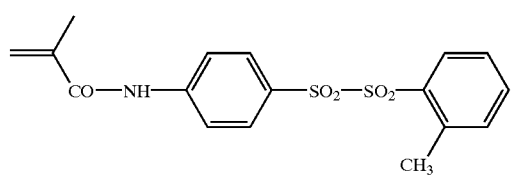
(IX-7)
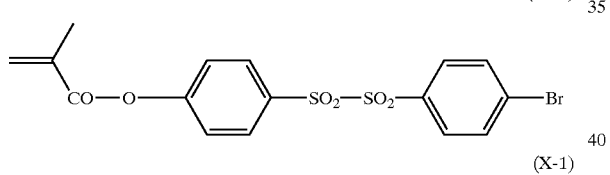
(IX-8)
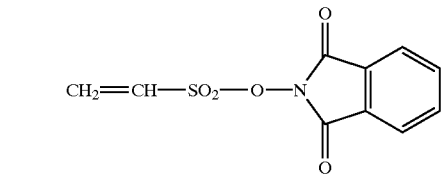
(X-1)
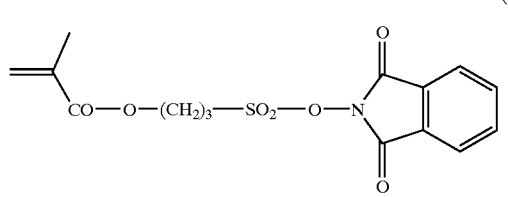
(X-2)
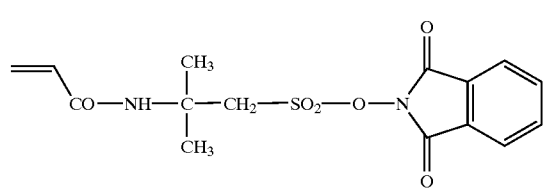
(X-3)
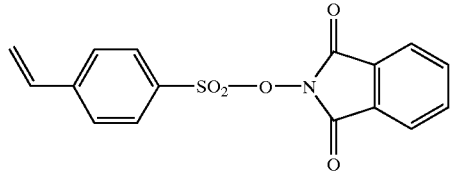
(X-4)
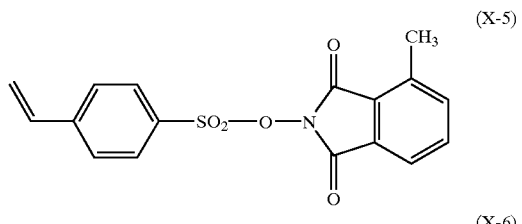
(X-5)
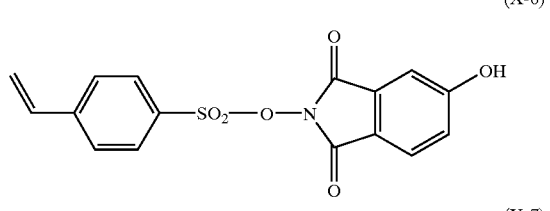
(X-6)
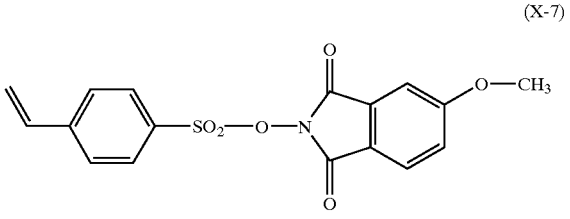
(X-7)
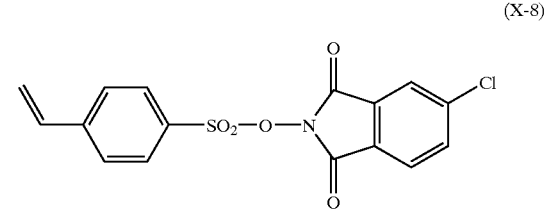
(X-8)
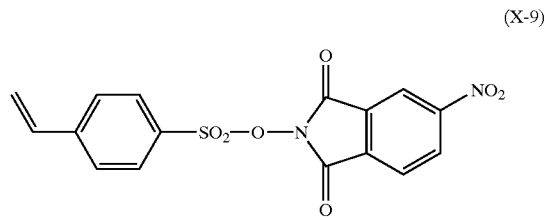
(X-9)
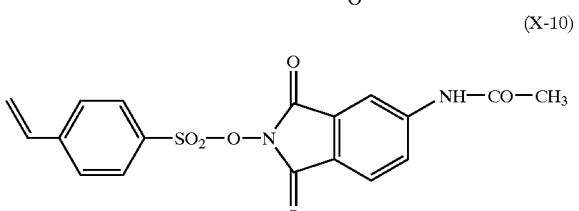
(X-10)
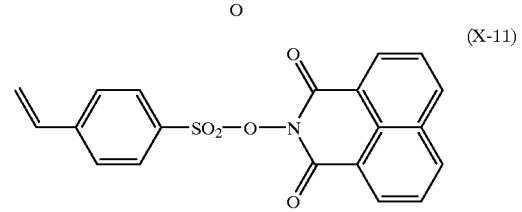
(X-11)

(X-12)

(X-13)

(X-14)

(X-15)

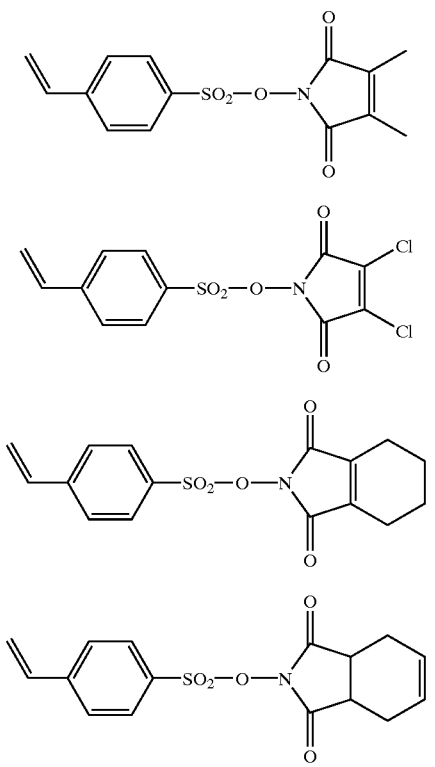

Monomers represented by the general formulas (VI), (VII), (VIII) and (X) are called active sulfonic esters and, in general, can be synthesized from corresponding sulfonic acid halogenide (preferably sulfonic acid chloride) and corresponding hydroxy compound. More particularly, these monomers can be synthesized according to a method described in Japanese Patent Application Laid-Open (JP-A) Nos. 2-100053 and 2-100054.

Monomers represented by the general formula (IX) are called disulfonyl compounds and can be synthesized from corresponding sulfonic acid halogenide (preferably sulfonic acid chloride) and sulfinic acid as described in Japanese Patent Application Laid-Open (JP-A) Nos. 2-100053 and 2-100054. Alternatively, these monomers can be synthesized according to a method described in DE3804316A1.

In the present invention, a polymer obtained by radical polymerization using at least one of monomers represented by the general formulas (VI) to (X) is employed. That is, a homopolymer obtained by using one kind of monomer, or copolymer obtained by using two or more kinds of monomers may be used.

In the present invention, more suitable polymer is a copolymer obtained by radical polymerization using at least one of monomers represented by the general formulas (VI) to (X) and at least one monomer other than those represented by general formulas (VI) to (X).

Examples of the other monomers are known monomers such as acrylic esters, methacrylic esters, acrylamides, methacrylamides, vinyl esters, styrenes, acrylic acid, methacrylic acid, acrylonitrile, maleic anhydride, maleimide and the like.

Among these other monomers, acrylic esters, methacrylic esters, acrylamides, methacrylamides, vinyl esters, styrenes, acrylic acid, methacrylic acid and acrylonitrile which have not more than 20 carbon atoms are particularly suitably used.

The content of monomer units represented by the general formulas (VI) to (X) contained in the copolymer is preferably 5 to 90% by weight, and more preferably 10 to 80% by weight.

The molecular weight of a polymer having at least one of constituent units represented by the general formulas (VI) to (X) used in the present invention is preferably not less than 2000, and more preferably in a range of 5000 to 300000 as expressed in weight-average molecular weight, and is preferably not less than 800, and more preferably in a range of 1000 to 250000 as expressed in number-average molecular weight. Polydispersity (weight-average molecular weight/number-average molecular weight) is preferably not less than 1, and more preferably in a range of 1.1 to 10.

[(B) Cross-linking Agent]

The cross-linking agent used in the present invention is at least one member selected from the group consisting of phenol compounds having two or more hydroxymethyl groups or alkoxymethyl groups in the molecular and containing 3 to 5 benzene nuclei and further having a molecular weight of not more than 1,200, and resol resins. First, the phenol compounds will be explained.

In the present invention, phenol compounds having two or more hydroxymethyl groups or alkoxymethyl groups in the molecule are used. An alkoxymethyl group having not more than 6 carbon atoms is preferable. More particularly, methoxymethyl group, ethoxymethyl group, n-propoxymethyl group, i-propoxymethyl group, n-butoxymethyl group, i-butoxymethyl group, sec-butoxymethyl group and t-butoxymethyl group are preferable.

In light of fastness of an image formed, it is essential that at least two hydroxymethyl group or alkoxymethyl group be present in the molecule. Preferably, 3 groups are present. More preferably, not less than 4 groups are present. It is not preferable that the number of the groups is less than 2, since an image is difficult to be formed. In addition, since the storability of a phenol compound having alkoxymethyl groups at an elevated temperature is higher than that of a phenol compound having hydroxymethyl groups, the phenol compound having alkoxymethyl groups is preferable.

When the molecular weight of a phenol compound exceeds 1,200, it is not preferable in light of the storability.

Particularly, preferable phenol compounds among these phenol compounds are shown below.

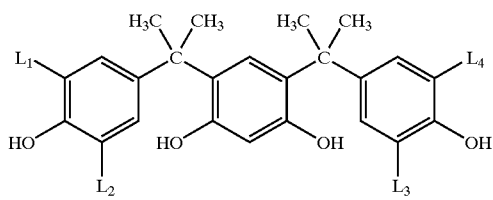

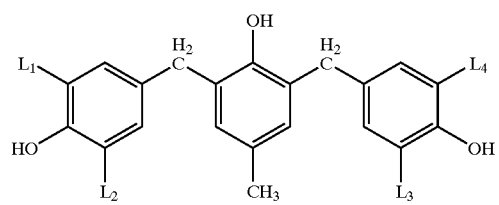

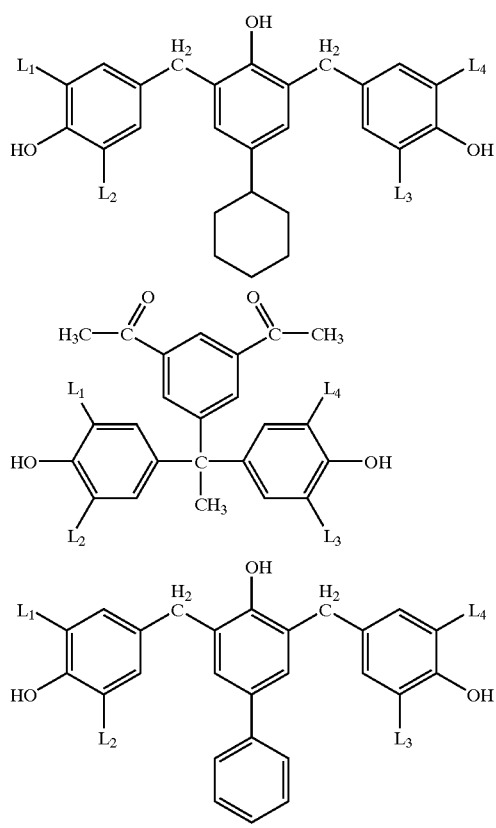
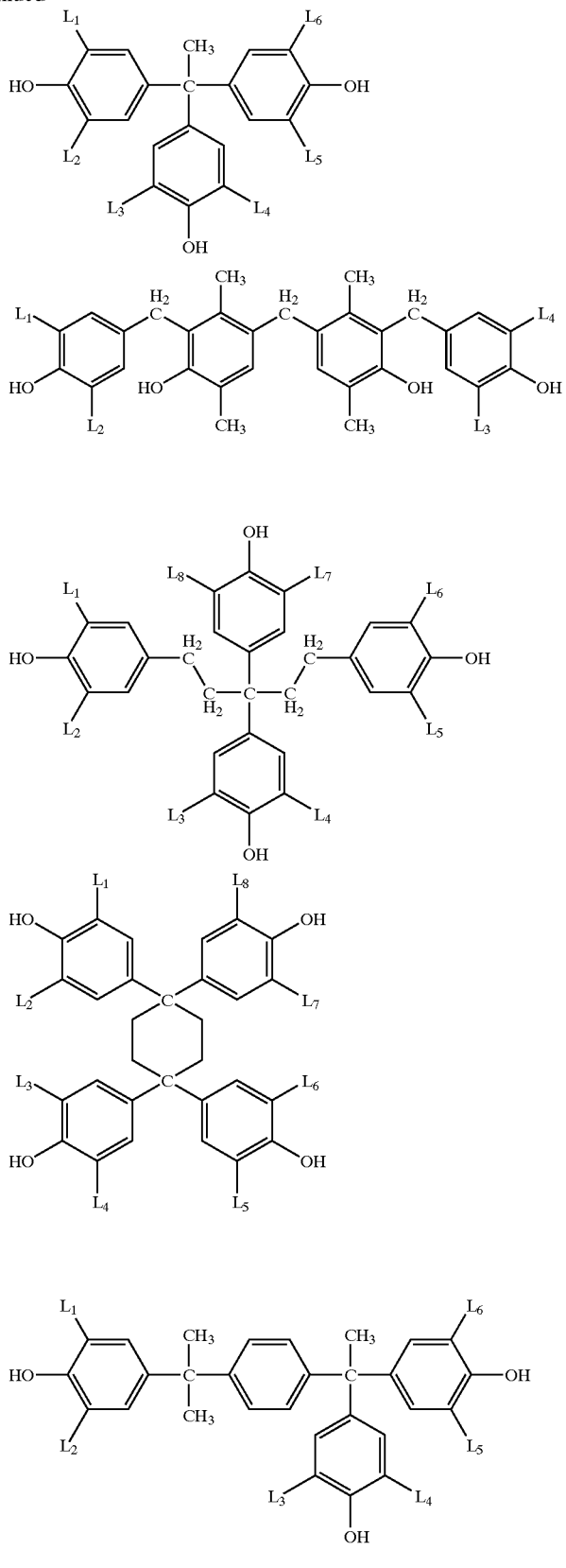

-continued

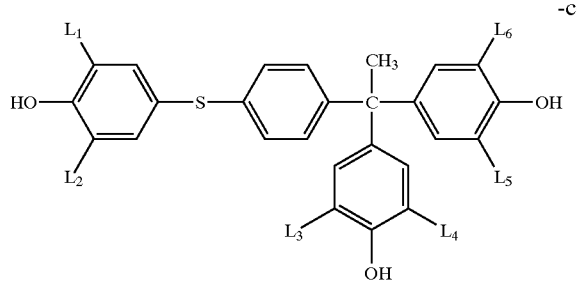
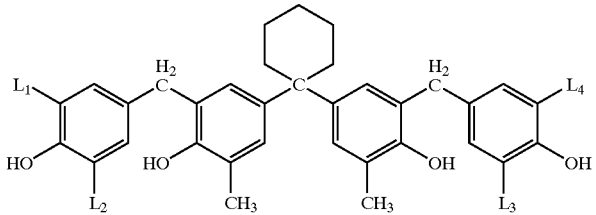
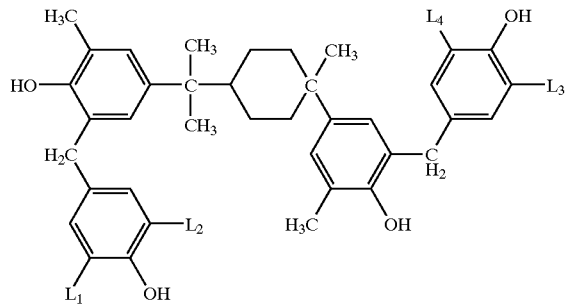
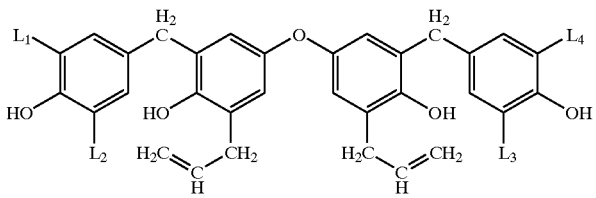
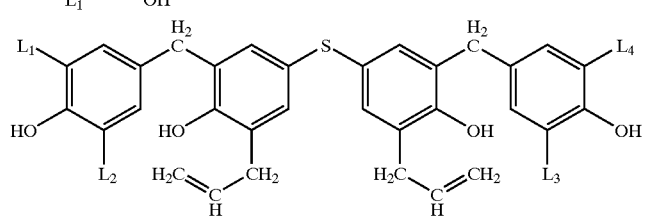
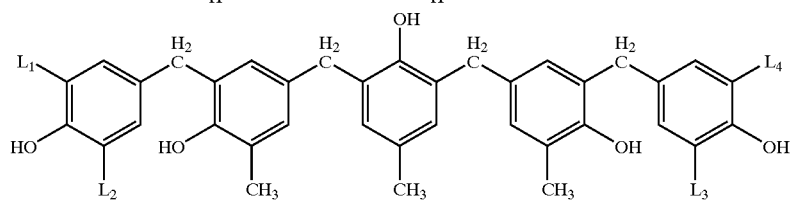
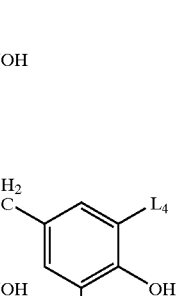
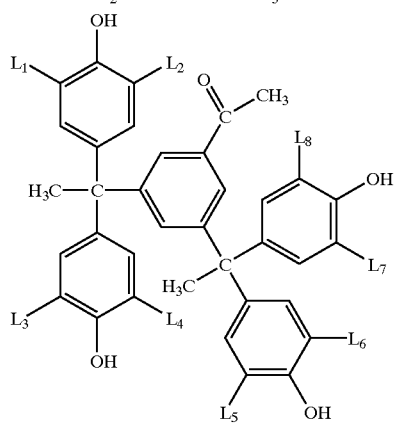
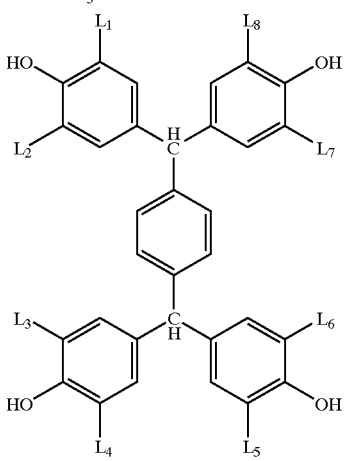

wherein $L_1$ to $L_8$ may be the same or different and each represent a hydroxymethyl group, a methoxymethyl group or an ethoxymethyl group.

The phenol compound having hydroxymethyl groups can be obtained by allowing to react a phenol compound which does not have hydroxymethyl groups corresponding thereto (compounds wherein $L_1$ to $L_8$ are hydrogen atoms in the above formulas) with formaldehyde in the presence of a basic catalyst. The reaction is preferably carried out at a temperature of not higher than 60° C. in order to prevent resinification and gelation. More particularly, the phenol compound having hydroxymethyl groups can be synthesized according to a method described in Japanese Patent Application Laid-Open (JP-A) Nos. 6-282067, 7-64285 and the like.

The phenol compound having alkoxymethyl groups can be obtained by allowing to react a phenol compound having hydroxymethyl groups corresponding to the alkoxymethyl groups with an alcohol in the presence of an acid catalyst. The reaction is preferably carried out at a temperature of not higher than 100° C. in order to prevent resinification and gelation. More particularly, the phenol compounds having alkoxymethyl groups can be synthesized according to a method described in EP632003A1 and the like.

In the present invention, the phenol compound having hydroxymethyl groups or alkoxymethyl groups is used in an amount of 5 to 70% by weight, preferably 10 to 65% by weight, particularly preferably 15 to 60% by weight based on the total weight of solid components in the image recording material. When the amount of addition of the phenol compound is less than 5% by weight, the durability of a recording layer deteriorates. When the amount exceeds 70% by weight, it is not preferable in view of the storability.

These phenol compounds may be used alone or in combination of two or more ones.

Then, a resol resin is explained as follows.

The resol resin used in the present invention is a resin obtained by condensing phenols and aldehydes under the basic conditions.

Preferable resol resins are obtained from, for example, phenol and formaldehyde, m-cresol and formaldehyde, bisphenol A and formaldehyde, and 4,4'-bisphenol and formaldehyde.

These resol resins have preferably weight-average molecular weight of 500 to 100,000 and number-average molecular weight of 200 to 50,000.

In the present invention, these resol resins are used by adding in an amount of 5 to 80% by weight, preferably 10 to 75% by weight, and particularly more preferably 20 to 70% by weight based on the total weight of solid components in the image recording material. When an amount of addition of the resol resin is less than 5% by weight, the durability of the recording layer deteriorates. When the amount exceeds 80% by weight, it is not preferable in light of the storability.

These resol resins may be used alone or in combination of two or more ones.

[(C) Infrared Absorbing Agent]

An infrared ray absorbing agent used in the present invention is a dye or a pigment which effectively absorbs infrared ray of wavelengths of 760 nm to 1200 nm. A dye or a pigment having maximum absorption at wavelengths of 760 nm to 1200 nm is preferable.

Commercially available or known dyes described in references (for example, "Senryo Binran", edited by Yukigoseikagaku Kyokai (Organic Synthetic Chemistry Association), published in 1970) maybe used. More particularly, these dyes include an azo dye, metal complex salt azo dye, pyrazoloneazo dye, naphthoquinone dye, anthraquinone dye, phthalocyanine dye, carbonium dye, quinoneimine dye, methine dye, cyanine dye, squarylium dyestuff, pyrylium salt, metal thiolato complex and the like.

Examples of preferable dyes are cyanine dyes described in Japanese Patent Application Laid-Open (JP-A) Nos. 58-125246, 59-84356, 59-202829, 60-78787 and the like, methine dyes described in Japanese Patent Application Laid-Open (JP-A) Nos. 58-173696, 58-181690, 58-194595 and the like, naphthoquinone dyes described in Japanese Patent Application Laid-Open (JP-A) Nos. 58-112793, 58-224793, 59-48187, 59-73996, 60-52940, 60-63744 and the like, squarylium dyestuffs described in Japanese Patent Application Laid-Open (JP-A) No. 58-112792 and the like, cyanine dyes described in British Patent No. 434,875.

A near infrared ray absorbing sensitizer described in U.S. Pat. No. 5,156,938 is also appropriately used. A substituted arylbenzo(thio)pyrylium salt described in U.S. Pat. No. 3,881,924, a trimethinethiapyrylium salt described in Japanese Patent Application Laid-Open (JP-A) No. 57-142645 (U.S. Pat. No. 4,327,169), pyrylium compounds described in Japanese Patent Application Laid-Open (JP-A) Nos. 58-181051, 58-220143, 59-41363, 59-84248, 59-84249, 59-146063 and 59-146061, a cyanine dyestuff described in Japanese Patent Application Laid-Open (JP-A) No. 59-216146, a pentamethinethiopyrylium salt described in U.S. Pat. No. 4,283,475, and pyrylium compounds described in Japanese Patent Application Publication (JP-B) Nos. 5-13514 and 5-19702 are preferably used.

Other examples of preferable dyes are near infrared ray absorbing agents described in U.S. Pat. No. 4,756,993, wherein the dyes are represented by the formulas (I) and (II).

Particularly preferable dyes among the above dyes are cyanine dyes squarylium dyes, pyrylium salts and nickel thiolate complexes.

Examples of pigments used in the present invention are commercially available pigments and those described in Color Index (C.I.) Manual, "Saishin Ganryo Binran (Modern Pigment Manual)", edited by Nippon Ganryo Gijyutsu Kyokai (Japan Pigment Technology Association), published in 1977; "Saishin Ganryo Oyo Gijyutsu (Modern Pigment Application Technology)", CMC Press, published in 1986; and "Insatsuink Gijyutsu (Printing Ink Technology)" CMC Press, published in 1984.

Examples of the pigment are black pigment, yellow pigment, orange pigment, brown pigment, red pigment, purple pigment, blue pigment, green pigment, fluorescent pigment, metal powder pigment, and polymer-bound pigment. More particularly, insoluble azo pigment, azo lake pigment, fused azo pigment, chelate azo pigment, phthalocyanine pigment, anthraquinone pigment, perylene and perynone pigment, thioindigo pigment, quinacridone pigment, dioxazine pigment, isoindolinone pigment, quinophthalone pigment, in-mold decorating lake pigment, azine pigment, nitroso pigment, nitro pigment, natural pigment, fluorescent pigment, inorganic pigment, carbon black and the like. Among these pigments, carbon black is preferable.

These pigments may be used without surface treatment, or they may be used after surface treatment. Surface treating method includes a method of coating a resin or wax on the surface of pigments, a method of adhering a surfactant to the surface of pigments, a method of binding a reactive substance (such as silane coupling agent, epoxy compound, polyisocyanate and the like to the surface of pigments). The above surface treating methods are described in "Kinzoku Sekken no Seishitsu to Oyo (Natures and Applications of Metal Soaps)", Saiwai Press, "Insatsuink Gijyutsu (Printing Ink Technology)", CMC Press, published in 1984; and "Saishin Ganryo Oyo Gijyutsu (Modern Pigment Application Technology)", CMC Press, published in 1986.

The particle size of the pigment is preferably in a range of 0.01 $\mu$m to 10 $\mu$m, more preferably in a range of 0.05 $\mu$m to 1 $\mu$m, particularly preferably in a range of 0.1 $\mu$m to 1 $\mu$m. When the particle size of the pigment is less than 0.01 $\mu$m, it is not preferable that the stability of the pigment dispersion in a sensitive layer coating solution. When the particle size exceeds 10 $\mu$m, it is not preferable in light of the uniformity of an image recording layer.

As a method of dispersing a pigment, known methods used for preparing an ink or toner may be employed. Examples of a dispersing machine are a ultrasonic dispersing machine, sand mill, attritor, pearl mill, super mill, ball mill, impeller, disperser, KD mill, colloid mill, dynatron, triple roll mill, pressure kneader and the like. Details thereof are described in "Saishin Ganryo Oyo Gijyutsu (Modern Pigment Application Technology)", CMC Press, published in 1988.

These dyes or pigments may be added in the image recording material in an amount of 0.01 to 50% by weight, preferably 0.1 to 10% by weight, particularly preferably 0.5 to 10% by weight in case of dyes, and particularly preferably 1.0 to 10% by weight in case of pigments, based on the total weight of solid components in the image recording material. When the amount of pigment or dye is less than 0.01% by weight, the sensitivity is lowered. When the amount exceeds 50% by weight, stains are formed in a non-image part on prints.

These dyes or pigments may be added in the same layer as that containing other components or they may be added in a separate layer.

[(D) Novolak Resin]

A novolak resin used in the present invention is a resin obtained by condensing a phenol and an aldehyde under the acidic conditions.

A preferable novolak resin includes a novolak resin obtained from phenol and formaldehyde, a novolak resin obtained from m-cresol and formaldehyde, a novolak resin obtained from p-cresol and formaldehyde, a novolak resin obtained from o-cresol and formaldehyde, a novolak resin obtained from octylphenol and formaldehyde, a novolak resin obtained from m-/p-mixed cresol and formaldehyde, a novolak resin obtained from a mixture of phenol/cresol (which may be any one of m-, p-, o- or m-/p-, m-/-o and o-/-p) and formaldehyde and the like.

These novolak resins have preferably the weight-average molecular weight of 800 to 200,000 and number-average molecular weight of 400 to 60,000.

In the present invention, these novolak resins are used in an amount of 5 to 90% by weight, preferably 10 to 85% by weight, particularly preferably 20 to 80% by weight based on the total weight of solid components in the image recording material. When the amount of the novolak resin to be added is less than 5% by weight, the durability of a recording layer is deteriorated. When the amount exceeds 90% by weight, it is not preferable in view of both sensitivity and durability.

These novolak resins may be used alone or in combination of two or more ones.

[Other Components]

In the present invention, the above 4 components are essential. However, various compounds may be added thereto, if necessary.

For example, a dye having a high absorption in a visible light region may be used as a coloring agent for an image.

More particularly, the coloring agent includes OIL YELLOW #101. OIL YELLOW #103. OIL PINK #312. OIL GREEN BG, OIL BLUE BOS, OIL BLUE #603. OIL BLACK BY. OIL BLACK BS and OIL BLACK T-505 (manufactured by Orient Kagakukogyo K.K.), Victoria Pure Blue, Crystal Violet (CI42555), Methyl Violet (CI42535), Ethyl Violet, Rhodamine B (CI145170B), Malachite Green (CI42000), Methylene Blue (CI52015), as well as dyes described in Japanese Patent Application Laid-Open (JP-A) NO. 62-293247.

Since these dyes facilitate to distinguish an image area and a non-image area after image formation, they are preferably added. An amount to be added is 0.01 to 10% by weight based on the total weight of solid components in the image recording material.

In order to enhance the stability for processing conditions, nonionic surfactants described in Japanese Patent Application Laid-Open (JP-A) Nos. 62-251740 and 3-208514, amphoteric surfactants described in Japanese Patent Application Laid-Open (JP-A) Nos. 59-121044 and 4-13149 may be added to the present image recording material.

Examples of nonionic surfactants are sorbitan tristearate, sorbitan monopalmitate, sorbitan trioleate, stearic acid monoglyceride, polyoxyethylene nonyl phenyl ether and the like.

Examples of amphoteric surfactants are alkyldi (aminoethyl) glycine, alkylpolyaminoethylglycine hydrochloride, 2-alkyl-N-carboxyethyl-N-hydroxyethylimidazolinium betaine and N-tetradecyl-N,N-betaine typeamphoteric surfactant (for example, trade name; AMOGEN K, manufactured by Daiichikogyo K.K.). An amount of the above nonionic surfactant and amphoteric surfactant in the image recording material is preferably 0.05 to 15% by weight, more preferably 0.1 to 5% by weight.

A plasticizer may be added to the present image recording material, if necessary, in order to impart the flexibility to the coating layer. Examples of the plasticizers are polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomer and polymer of acrylic acid or methacrylic acid.

In addition to these, epoxy compounds, vinyl ethers or the like may be added therein.

The image recording material of the present invention can be prepared by dissolving respective components in a solvent and coating the resultant solution on an appropriate support. Examples of the solvents are not limited to specified ones but include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyllactone, toluene, water and the like. These solvents are used alone or in admixture thereof. The concentration of the above components (total solid components including additives) in the solvent is preferably 1 to 50% by weight. An amount of a coating (solid content) on a support after coating and drying varies with the use and is preferably 0.5 to 5.0 g/m$^2$, in general, for a planographic printing plate. Various methods may be used for effecting coating, such as bar coater coating, spin coating, spray coating, curtain coating, dip coating, air knife coating, blade coating, roll coating and the like. As a coated amount becomes smaller, the apparent sensitivity becomes higher, but the coating properties of the image recording layer deteriorates.

A surfactant for improving the coating properties, for example, a fluorosurfactant described in Japanese Patent Application Laid-Open (JP-A) No. 62-170950 may be added to the image recording layer. An amount to be added is preferably 0.01 to 1% by weight, more preferably 0.05 to 0.5% by weight based on total weight of solid components in the image recording material.

A support used in the present invention is a dimensionally-stable plate-like material. Examples thereof includes a paper, a paper laminated with a plastic (such as polyethylene, polypropylene, polystyrene and the like), a metal plate (such as aluminium, zinc, copper and the like), a plastic film (such as cellulose diacetate, cellulose triacetate, cellulose propionate, cellulose butyrate, cellulose acetate butyrate, cellulose nitrate, polyethyleneterephthalate, polyethylene, polystyrene, polypropylene, polycarbonate, polyvinyl acetal and the like), a paper or a plastic film laminated or deposited with any one of the above metals.

A polyester film and an aluminium plate are preferable as a support in the present invention. Among them, an aluminium plate is particularly preferable by virtue of its dimensional stability and low cost. Suitable aluminium plate is a pure aluminium plate and an alloy plate having aluminium as a main component and containing trace quantities of other elements, including a plastic film laminated or deposited with aluminium. Examples of the other elements are silicon, iron, manganese, copper, magnesium, chromium, zinc, bismuth, nickel, titanium and the like. Content of the other elements in the alloy is at most 10% by weight. Particularly suitable aluminium is pure aluminium. However, since it is difficult to manufacture completely pure aluminium in view of refining techniques, trace quantities of other elements may be contained. As mentioned above, components of aluminium plate used in the present invention are not limited to specific ones. Aluminium plates which have been previously known and used can be arbitrarily used. The thickness of the aluminium plate used in the present invention is approximately 0.1 mm to 0.6 mm, preferably 0.15 mm to 0.4 mm, particularly preferably 0.2 mm to 0.3 mm.

Prior to roughening of the aluminium plate, the degreasing treatment is carried out using a surfactant, an organic solvent, an aqueous alkaline solution or the like in order to remove rolling oil on the surface, if necessary.

Roughening of the aluminium plate surface is carried out by various methods, for example, by a method using mechanical roughening, a roughening method of electrochemically dissolving the surface or a method of selectively dissolving the surface chemically. As a mechanical method, methods such as ball abrasion, brush abrasion, blast abrasion, buff abrasion and the like have been known. An electrochemical roughening method includes a method using alternating or direct current in a hydrochloric acid or nitric acid electrolysis solution. Alternatively, both methods can be performed by a combination thereof as disclosed in Japanese Patent Application Laid-Open (JP-A) No. 54-63902.

The aluminium plate thus roughened is subjected to an alkali etching treatment and neutralization treatment, if necessary and, thereafter, to anodization in order to enhance the water retention characteristics and abrasion resistance, as occasion demands. As electrolytes for anodizing the aluminum plate, various electrolytes which form a porous oxide layer can be employed. In general, sulfuric acid, phosphoric acid, oxalic acid, chromic acid or mixed acid thereof are used. The concentration of the electrolyte is appropriately selected depending upon the kind of the electrolyte.

Conditions for anodizing treatment are not limited to specific ones since they vary with the kind of the electrolyte. Suitable conditions are in the range of concentration of the electrolyte of 1 to 80% by weight, temperature of the solution of 5 to 70° C., current density of 5 to 60 A/dm$^2$ voltage of 1 to 100 V and electrophoresis time of 10 seconds to 5 minutes.

When an amount of an anodized oxide layer is less than 1.0 g/m$^2$, the plate wear is insufficient and scratches are easily produced in a non-image part of the planographic printing plate and, thereby, so-called "tinting due to scratches" is easily produced.

After anodizing treatment, the surface of the aluminium plate is subjected to a process for imparting hydrophilicity thereto, if necessary. An example of such treatments includes a method using alkaline metal silicate (for example, aqueous solution of sodium silicate) as disclosed in U.S. Pat. Nos. 2,714,066, 3,181,461, 3,280,734 and 3,902,734. In this method, a support is treated by immersing in an aqueous solution of sodium silicate or treated by electrophoresis.

Other methods include a method of treatment of a support with potassium fluorozirconate (as disclosed in Japanese Patent Application Publication (JP-B) No. 36-22063) or with polyvinylphosphonic acid (as disclosed in U.S. Pat. Nos. 3,276,868, 4,153,461 and 4,689,273).

In the image recording material of the present invention, a subbing layer may be provided on the support, as occasion demands.

As a component in the subbing layer, various organic compounds are used and are selected from, for example carboxymethyl cellulose, dextrin, gum arabic, phosphonic acid having an amino group (such as 2-aminoethylphosphonic acid and the like), organic phosphonic acid which may be substituted (such as phenylphosphonic acid, naphthylphosphonic acid, alkylphosphonic acid, glycelophosphonic acid, methylenediphosphonic acid and ethylenediphosphonic acid), organic phosphoric acid which may be substituted (such as phenylphosphoric acid, naphthylphosphoric acid, alkylphosphoric acid and glycerophosphoric acid), organic phosphinic acid which may be substituted (such as phenylphosphinic acid, naphthylphosphinic acid, alkylphosphinic acid and glycerophosphinic acid), amino acids such as glycine and β-alanine, amine hydrochloride having hydroxy group (such as triethanolamine hydrochloride and the like). Two or more these organic compounds may be used in admixture thereof.

A coating amount of the organic subbing layer is suitably 2 to 200 mg/m$^2$.

As described above, a planographic printing plate can be prepared by using the image recording material of the present invention. This planographic printing plate is imagewisely exposed to infrared light having wavelengths of 760 nm to 1200 nm emitted from a solid-state laser or semiconductor laser. In the present invention, the developing processing may be carried out immediately after the laser irradiation. Preferably, heating treatment of the printing plate is carried out between the laser irradiation step and the development step. Heating is preferably carried out at a temperature of 80° C. to 150° C. for 10 seconds to 5 minutes. The heating treatment can reduce the laser energy for laser irradiation necessary for image recording.

After heating treatment, as occasion demands, the present image recording material is developed with an aqueous alkaline solution.

As an developer and replenisher, an aqueous alkaline solution which has been previously known can be used for the present image recording material. Examples thereof are inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium bicarbonate, potassium bicarbonate, ammonium bicarbonate, sodium borate, potassium borate, ammonium borate, sodium hydroxide, ammonium hydroxide, potassium hydroxide and lithium hydroxide. Further, organic alkali salts such as monomethylamine, dimethylamine, trimethylamine, monoethylamine, diethylamine, triethylamine, monoisopropylamine, diisopropylamine, triisopropylamine, n-n-butylamine, monoethanolamine, diethanolamine, triethanolamine, monoisopropanolamine, diisopropanolamine, ethylenimine, ethylenediamine, pyridine and the like are also used.

These alkali agents may be used alone or in combination of two or more ones.

Among developers containing these alkali agents, particularly preferable developers are an aqueous solution of silicate salt such as sodium silicate, potassium silicate and the like. This is because the developing properties can be adjusted by changing a ratio of silicon oxide ($SiO_2$) as a component of silicate salt and alkali metal oxide $M_2O$ and their concentrations. For example, alkali metal silicates described in Japanese Patent Application Laid-Open (JP-A) No. 54-62004, Japanese Patent Application Publication (JP-B) No. 57-7427 and the like are effectively used.

It has been known that, when the development is carried out using an automatic developing machine, a large quantity of planographic printing plates can be processed without replacing a developer in a developing tank for a long period of time, by adding to the developer an aqueous solution having higher alkalinity (replenisher) than that of the developer. This replenishing method is preferably used in the present invention.

In order to enhance or reduce developing properties, or to improve dispersing property of tailings formed in a developer and ink-affinity in an image part of a printing plate, various surfactants and organic solvents can be added to the developer and replenisher, if necessary. Examples of preferable surfactants are anionic, cationic, nonionic and amphoteric surfactants.

Further, a reducing agent such as hydroquinone, resorcin, sodium or potassium salt of inorganic acid (such as sulfurous acid, hydrogen sulfurous acid and the like), and further, organic carboxylic acids, anti-foaming agents and hard water softeners may be added to the developer and replenisher.

A printing plate which has been developed, by using the above developer and replenisher is post-treated with rinsing water, rinse containing surfactants, and the like, and desensitizing solution containing gum arabic or starch derivative. When the present image recording material is used as a printing plate for printing, a variety of combinations of the above described processing may be used for post-treatment.

Recently, an automatic developing machine has been widely used in plate making and printing industries in order to rationalize and standardize the plate making operation. In general, this automatic developing machine comprises a developing part and a post-treating part, and further comprises a device for conveying a printing plate, processing tanks and spraying devices, wherein developing processing is carried out by spraying processing solution pumped up by a pump from a spray nozzle to the printing plate after exposure, while the printing plate is being horizontally conveyed. In addition, there has also been known recently a processing method in which a printing plate is immersed in a processing solution tank filled with the processing solution while the printing plate is being conveyed by guide rolls in the processing solution. In such an automatic processing, the printing plate can be processed while replenishing a replenisher to each processing solution depending upon an amount of the printing plate to be processed, working time and the like.

Alternatively, so-called discarding-processing without using a replenisher can be applied to the present invention, where a printing plate is processed with a fresh processing solution which has not been substantially used.

The planographic printing plate thus obtained can be supplied to printing step, if desired, after coated with desensitizing gum. When a planographic printing plate having a higher plate wear is desired, the plate is subjected to burning treatment.

When a planographic printing plate is subjected to burning treatment, the plate is preferably treated with a counter-etching solution as described in Japanese Patent Application Publication (JP-B) Nos. 61-2518, 55-28061, Japanese Patent Application Laid-Open (JP-A) Nos. 62-31859 and 61-159655 prior to the burning treatment.

Such the treatment includes a method of coating a counter-etching solution on the plate using a sponge or an absorbent cotton impregnated with the counter-etching solution, or coating a counter-etching solution on the plate by immersing the plate in a tray filled with the counter-etching solution, and a method of coating the counter-etching solution using an automatic coater.

In general, an amount of the counter-etching solution to be coated is suitably 0.03 t0.8 $g/m^2$(dry weight).

The planographic printing plate coated with the counter-etching solution is dried, if necessary, and heated to an elevated temperature with a burning processor (such as burning processor: BP-1300, commercially available from Fuji Photo Film Co., Ltd.). Heating temperature and time are preferably in a range of 180 to 300° C. and 1 to 20 minutes, respectively, depending upon the kind of components which form an image.

The burning-treated planographic printing plate may be subjected to the treatments which have been previously known, such as washing with water, gum coating and the like. When a counter-etching solution containing a water-soluble polymer or the like is used, so-called desensitizing treatment such as gum coating and the like can be omitted.

The planographic printing plate obtained by such a treatment can be employed for multiple printing using an offset press and the like.

The following Examples further illustrate the present invention in detail but are not to be construed to limit the scope thereof.

Synthesis Example 1

To a 10% aqueous solution of potassium hydroxide was added 20 g of 1-[α-methyl-α-(4-hydroxyphenyl)ethyl]-4-[α,α-bis(4-hydroxyphenyl)ethyl]benzene (TRISP-PA; manufactured by Honshu Chemical Industry Co., Ltd.) to dissolve by stirring. Then, 60 ml of 37% formalin was added thereto little by little at room temperature over 1 hour while stirring the solution. After stirred further at room temperature for 6 hours, the solution was placed in a dilute sulfuric acid. The precipitates were filtered, washed well with water and recrystallized from 30 ml of methanol to obtain 20 g of a phenol compound [HM-1], of the following structure, having hydroxymethyl groups as white powders. The purity was 92% (liquid chromatography)

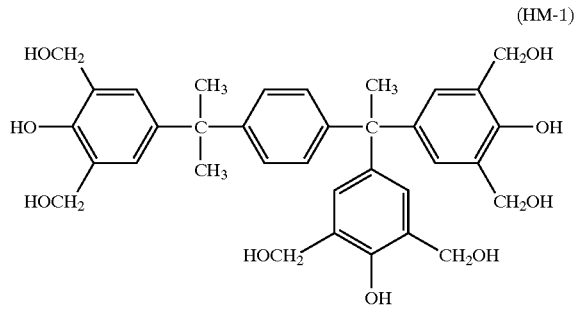

(HM-1)

Synthesis Example 2

To 1 liter of methanol was added 20 g of the phenol compound [HM-1] having hydroxymethyl groups obtained in Synthesis Example 1 to dissolve by heating and stirring. To this solution was then added 1 ml of concentrated sulfuric acid, followed by heating to reflux for 12 hours. After completion of the reaction, the reaction solution was cooled and 2 g of potassium carbonate was added thereto. After this mixture was concentrated well, 300 ml of ethyl acetate was added thereto. After this solution was washed with water, the solution was concentrated to dry to obtain 22 g of a phenol compound, of the following structure, having methoxymethyl groups as white solid. The purity was 90% (liquid chromatography).

(MM-1)

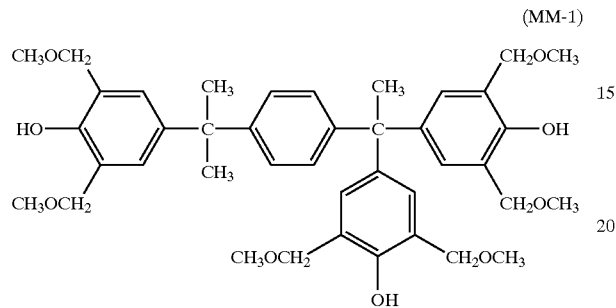

According to the similar procedures, the following phenol compounds were synthesized.

(HM-2)

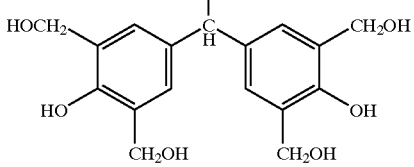

(MM-2)

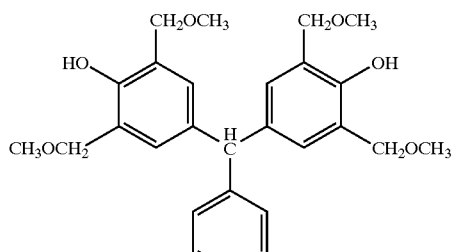

(HM-3)

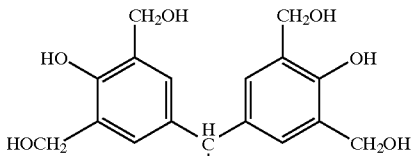

(MM-3)

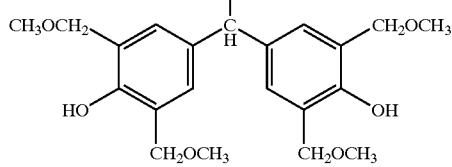

(HM-4)

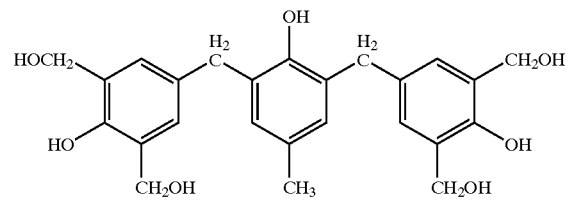

(MM-4)

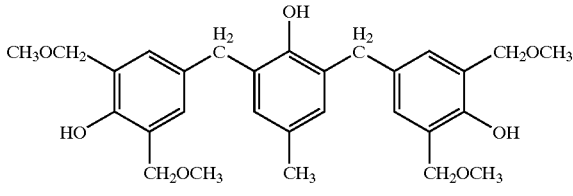

(MM-5)

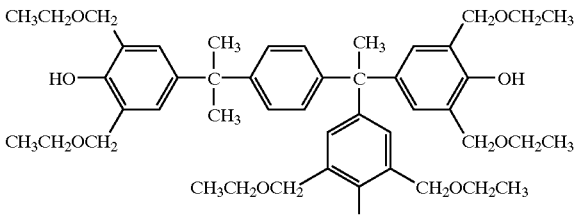

[Synthesis of Polymer]

A polymer represented by (VI-P) was synthesized by referring to Japanese Patent Application Laid-Open (JP-A) Nos. 2-100053 and 2-100054. Weight-average molecular weight (GPC, polystyrene standard) was in a range of 10000 to 70000.

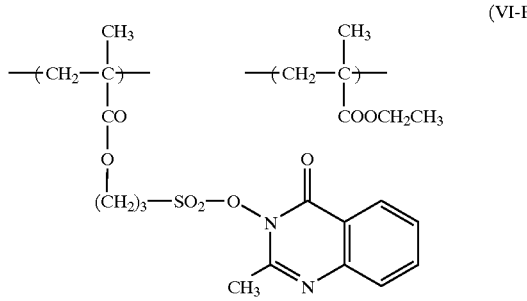

EXAMPLES 1 to 12

After an aluminium plate (type 1050) having the thickness of 0.30 mm was washed with trichloroethylene to degrease, the plate surface was sand-blasted using a nylon brush and a aqueous suspension of 400 mesh PAMISTON and washed well with water. This plate was immersed in a 25% aqueous solution of sodium hydroxide at 45° C. for 9 seconds to etch, washed with water, immersed in 2% $HNO_3$ for 20 seconds and washed with water. At this point, an etched amount of the sand-blasted surface was about 3 $g/m^2$. Then, after 3 $g/m^2$ of a direct current-anodized oxide film was formed on this plate using 7% $H_2SO_4$ as an electrolysis solution at current density of 15 $A/dm^2$, the plate was washed with water and dried.

Then, the following subbing solution was coated on this aluminium plate and dried at 80° C. for 30 seconds. An coated amount after drying was 10 $mg/m^2$.

| (Subbing solution) | |
|---|---|
| β-alanine | 0.1 g |
| Phenylphosphonic acid | 0.05 g |
| Methanol | 40 g |
| Pure water | 60 g |

Then, 10 kinds of solutions [P-1] to [P-10] were prepared by varying the kind of the compound represented by the general formulas of the present invention in the following solution [P]. A solution [P-11] was prepared using a polymer obtained by polymerizing a monomer represented by the general formula (VI) of the present invention. Further, a solution [P-12] was prepared using the compound represented by the general formula (I) of the present invention, and 1.0 g of a resol resin obtained from bisphenol A and formaldehyde in place of the phenol compound. These solutions were coated on an aluminium plate which had been subbed, respectively, followed by drying at 100° C. for 1 minute to obtain negative type planographic printing plates [P-1] to [P-12]. The weight after drying was 1.7 $g/m^2$.

| Solution [P] | |
|---|---|
| Compound represented by the general formulas (I) to (V) or polymer from monomer of the formula (VI) | 0.2 g |
| Phenol compound | 0.7 g |
| Infrared absorbing agent NK-3508 manufactured by Nippon Kankoshikiso Kenkyujo K.K.) | 0.15 g |
| Novolak resin obtained from phenol and formaldehyde (weight-average molecular weight 10000) | 1.5 g |
| Dye converted ion pair of Victoria Pure Blue BOH into 1-naphthalenesulfonic acid | 0.05 g |
| MEGAFACK F-177 (Manufactured by Dainippon Ink & Chemicals, Inc., fluoro type surfactant) | 0.06 g |
| Methyl ethyl ketone | 15 g |
| 1-Methoxy-2-propanol | 5 g |
| Methyl alcohol | 7 g |

Compounds or polymers used for the solutions [P-1] to [P-12] are shown in Table 1.

TABLE 1

| Examples No. | Planographic printing plate | Compound or polymer in the present invention | Phenol compound |
|---|---|---|---|
| Example 1 | [P-1] | [I-7] | [HM-1] |
| Example 2 | [P-2] | [II-4] | [HM-2] |
| Example 3 | [P-3] | [III-5] | [HM-3] |
| Example 4 | [P-4] | [IV-12] | [HM-4] |
| Example 5 | [P-5] | [V-1] | [HM-1] |
| Example 6 | [P-6] | [I-7] | [MM-1] |
| Example 7 | [P-7] | [II-4] | [MM-2] |
| Example 8 | [P-8] | [III-5] | [MM-3] |
| Example 9 | [P-9] | [IV-12] | [MM-4] |
| Example 10 | [P-10] | [V-1] | [MM-5] |
| Example 11 | [P-11] | [VI-P] | [HM-1] |
| Example 12 | [P-12] | [I-7] | Resol resin |

After the resulting negative type planographic printing plates [P-1] to [P-11] were stored at an elevated temperature of 45° C. for 3 days and 5 days, the plates were exposed to infrared ray having wavelengths of 1064 nm, emitted from solid-state YAG laser. After exposure, the plates were treated by heating at 120° C. for 2 minutes and treated thorough an automatic developing machine filled with a developer, DP-4 (1:8), and a rinse solution, FR-3 (1:7), (manufactured by Fuji Photo Film Co., Ltd.). Then, the plates were processed with a gum solution, GU-7 (1:1), (manufactured by Fuji Photo Film Co., Ltd.) and subjected to printing by the use of a Heidel KOR-D machine. After printing, non-image parts of a print were observed to examine whether stains we reformed on the non-image part. The results are shown in Table 2. When stored at an elevated temperature for 3 days, satisfactory prints without stains on the non-image parts were obtained in every cases. On the other hand, when stored for 5 days, stains were slightly recognized in [P-1] to [P-5]. In [P-9], stains were extremely slight although a degree of stains was lower than that in any case of [P-1] to [P-5]. However, in [P-6], [P-7], [P-8], [P-10] and [P-11], satisfactory prints without stains on non-image parts were obtained.

After the resulting negative type planographic printing plate [P-12] was stored under elevated temperature of 40° C. and high humidity of 70% for 3 days, the plate was exposed to infrared ray having wavelength of 1064 nm emitted from solid-state YAG laser. After exposure, the plate was treated by heating at 110° C. for 1 minute and treated thorough an automatic developing machine using filled with a developer, DP-4 (1:8), and a rinse solution, FR-3 (1:7), (manufactured by Fuji Photo Film Co., Ltd.). Then, the plate was processed with a gum solution, GU-7 (1:1), (manufactured by Fuji Photo Film Co., Ltd.), followed by printing by the use of a Heidel KOR-D machine. After printing, non-image parts of a print were observed to examine whether stains were formed on the non-image part. The result is shown in Table 2. A satisfactory print without stains on the non-image part was obtained.

Comparative Example 1

A negative type planographic printing plate [Q] was prepared according to the same manner as that in Examples 1 to 11 except that diphenyliodonium hexafluorophosphate (described in Example in Japanese Patent Application Laid-Open (JP-A) No. 7-20629) was used in place of the compounds represented by the general formulas (I) to (V) of the present invention or polymer from monomer represented by the formula (VI) of the present invention and that a resol resin (weight-average molecular weight 1600) obtained from bisphenol A and formaldehyde was used in place of the phenol compound of the present invention. The resulting planographic printing plate [Q] was stored at an elevated temperature of 45° C. for 3 days, followed by image formation and printing as in Examples 1 to 11. After printing, non-image parts of a print were observed to examine whether stains were formed on the non-image part. The results shown in Table 2 indicate that stains were formed on the non-image part.

When not stored at an elevated temperature, stains on the non-image part were not recognized upon print even in the planographic printing plate [Q].

Comparative Example 2

A negative type planographic printing plate [R] was prepared according to the same manner as that in Examples 1 to 11 except that 2,4,6-tris(trichloromethyl)-s-triazine (T-1 described in Example in Japanese Patent Application Laid-Open (JP-A) No. 7-271029) was used in place of the compounds represented by the general formulas (I) to (V) of the present invention or polymer from monomer represented by the formula (VI) of the present invention and that a resol resin (weight-average molecular weight 1600) obtained from bisphenol A and formaldehyde was used in place of the phenol compound of the present invention. The resulting planographic printing plate [R] was stored at an elevated temperature of 45° C. for 3 days, followed by image formation and printing as in Examples 1 to 11. After printing, non-image parts of a print were observed to examine whether stains were formed on the non-image part. The results shown in Table2 indicate that stains were formed on the non-image part.

When not stored at an elevated temperature, stains on the non-image part were not recognized upon print even in the planographic printing plate [R].

TABLE 2

| Example No. | Planographic printing plate | Stain on non-image part upon print | |
|---|---|---|---|
| | | Storage for 3 days | Storage for 5 days |
| Example 1 | [P-1] | None | Slight |
| Example 2 | [P-2] | None | Slight |
| Example 3 | [P-3] | None | Slight |
| Example 4 | [P-4] | None | Slight |
| Example 5 | [P-5] | None | Slight |
| Example 6 | [P-6] | None | None |
| Example 7 | [P-7] | None | None |
| Example 8 | [P-8] | None | None |
| Example 9 | [P-9] | None | Extremely slight |
| Example 10 | [P-10] | None | None |
| Example 11 | [P-11] | None | None |
| Example 12 | [P-12] | None | None |
| Comparative Example 1 | [Q] | Observed | — |
| Comparative Example 2 | [R] | Observed | — |

It can be understood from Examples 1 to 12 and Comparative Examples 1 and 2 that the planographic printing plates obtained by using the negative working image recording material of the present invention are excellent in the storability at an elevated temperature. Further, it is seen that the use of the phenol compound having alkoxymethyl group gives better storability at an elevated temperature than the use of the phenol compound having hydroxymethyl group.

EXAMPLES 13–23

Eleven kinds of solutions [S-1] to [S-11] were prepared by varying the kind of the compounds represented by the general formulas of the present invention in the following solution [S]. These solutions were coated on an aluminium plate used in Examples 1 to 12 which had been subbed respectively, followed by drying at 100° C. for 1 minute to obtain negative type planographic printing plates [S-1] to [S-11]. The weight after drying was 1.7 g/m².

| Solution [S] | |
|---|---|
| Compound represented by the general formulas (I) to (V) | 0.2 g |
| Phenol compound | 0.7 g |
| Infrared absorbing agent NK-2268 (manufactured by Nippon Kankoshikiso Kenkyujo K.K.) | 0.15 g |
| Novolak resin obtained from phenol and formaldehyde (weight-average molecular weight 10000) | 1.5 g |
| Dye converted ion pair of Victoria Pure Blue BOH into 1-naphthalanesulfonic acid | 0.03 g |
| MEGAFACK F-177 (Manufactured by Dainippon Ink & Chemicals, Inc., fluoro type surfactant) | 0.06 g |
| Methyl ethyl ketone | 15 g |
| 1-Methoxy-2-propanol | 5 g |
| Methyl alcohol | 7 g |

Compounds used for the solutions [S-1] to [S-11] are shown in Table 3.

TABLE 3

| Example No. | Planographic printing plate | Compounds represented by general formulas (I) to (V) | Phenol compound |
|---|---|---|---|
| Example 13 | [S-1] | [I-7] | [HM-1] |
| Example 14 | [S-2] | [IV-4] | [HM-2] |
| Example 15 | [S-3] | [V-14] | [HM-3] |

TABLE 3-continued

| Example No. | Planographic printing plate | Compounds represented by general formulas (I) to (V) | Phenol compound |
|---|---|---|---|
| Example 16 | [S-4] | Each 0.1 g of [I-7] and [IV-4] | [HM-4] |
| Example 17 | [S-5] | Each 0.1 g of [I-7] and [IV-4] | Each 0.35 g of [HM-1] and [MM-4] |
| Example 18 | [S-6] | Each 0.1 g of [I-7] and [IV-4] | Each 0.35 g of [HM-1] and [HM-5] |
| Example 19 | [S-7] | [I-7] | [MM-1] |
| Example 20 | [S-8] | [IV-4] | [MM-2] |
| Example 21 | [S-9] | [V-14] | [MM-3] |
| Example 22 | [S-10] | Each 0.1 g of [I-7] and [IV-4] | [MM-4] |
| Example 23 | [S-11] | Each 0.1 g of [I-7] and [IV-4] | Each 0.35 g of [MM-1] and [MM-4] |

After the resulting negative type planographic printing plates [S-1] to [S-11] were stored at an elevated temperature of 45° C. for 3 days and 5 days, the plates were exposed to infrared ray having wavelength of 830 nm emitted from semiconductor laser. After exposure, the plates were treated by heating at 120° C. for 2 minutes and treated thorough an automatic developing machine filled with a developer, DP-4 (1:8), and a rinse solution, FR-3 (1:7), (manufactured by Fuji Photo Film Co., Ltd.). Then, the plates were processed with a gum solution, GU-7 (1:1), (manufactured by Fuji Photo Film Co., Ltd.), followed by printing by the use of a Heidel KOR-D machine. After printing, non-image parts of the print were observed to examine whether stains were formed on the non-image part. The results are shown in Table 4. When stored at an elevated temperature for 3 days, satisfactory prints without stains on the non-image parts were obtained in every cases. On the other hand, when stored for 5 days, stains were slightly recognized in [S-1] to [S-6]. In [S-8], stains were extremely slight although a degree of stains was lower than that in any case of [S-1] to [S-6]. However, in [S-7], [S-9], [S-10] and [S-11], satisfactory prints without stains on non-image parts were obtained.

Comparative Example 3

A negative type planographic printing plate [T] was prepared according to the same manner as that in Examples 13 to 23 except that diphenyliodonium hexafluorophosphate (described in Example in Japanese Patent Application Laid-Open (JP-A) No. 7-20629) was used in place of the compounds represented by the general formulas (I) to (V) of the present invention and that a resol resin (weight-average molecular weight 1600) obtained from bisphenol A and formaldehyde was used in place of the phenol compound of the present invention, in the solution [S] used in Examples 13 to 23. The resulting planographic printing plate [T] was stored at an elevated temperature of 45° C. for 3 days, followed by image formation and printing as in Examples 13 to 23. After printing, non-image parts of a print were observed to examine whether stains were formed on the non-image part. The results shown in Table 4 indicate that stains were formed on the non-image part.

When not stored at an elevated temperature, stains on the non-image portion were not recognized upon print even in the planographic printing plate [T].

Comparative Example 4

A negative type planographic printing plate [U] was prepared according to the same manner as that in Examples 13 to 23 except that 2,4,6-tris(trichloromethyl)-s-triazine (T-1 described in Example in Japanese Patent Application Laid-Open (JP-A) No. 7-271029) was used in place of the compounds represented by the general formulas (I) to (V) of the present invention and that a resol resin (weight-average molecular weight 1600) obtained from bisphenol A and formaldehyde was used in place of the phenol compound of the present invention, in the solution [S] used in Examples 13 to 23. The resulting planographic printing plate [U] was stored at an elevated temperature of 45° C. for 3 days, followed by image formation and printing as in Examples 13 to 23. After printing, non-image parts of a print were observed to examine whether stains were formed on the non-image part. The results shown in Table 4 indicate that stains were formed on the non-image part.

When not stored at an elevated temperature, stains on the non-image portion were not recognized upon print even in the planographic printing plate [U].

TABLE 4

| | | Stain on non-image part upon print | |
|---|---|---|---|
| Example No. | Planographic printing plate | Storage for 3 days | Storage for 5 days |
| Example 13 | [S-1] | None | Slight |
| Example 14 | [S-2] | None | Slight |
| Example 15 | [S-3] | None | Slight |
| Example 16 | [S-4] | None | Slight |
| Example 17 | [S-5] | None | Slight |
| Example 18 | [S-6] | None | Slight |
| Example 19 | [S-7] | None | None |
| Example 20 | [S-8] | None | Extremely slight |
| Example 21 | [S-9] | None | None |
| Example 22 | [S-10] | None | None |
| Example 23 | [S-11] | None | None |
| Comparative Example 3 | [T] | Observed | — |
| Comparative Example 4 | [U] | Observed | — |

It can be understood from Examples 13 to 23 and Comparative Examples 3 and 4 that the planographic printing plates obtained by using the negative, working image recording material of the present invention are excellent in the storability at an elevated temperature. Further, it is seen that the use of the phenol compound having alkoxymethyl group gives better storability at an elevated temperature than the use of the phenol compound having hydroxymethyl group.

What is claimed is:

1. A planographic printing plate material comprising an aluminum substrate and a negative working image recording layer provided on the substrate and comprised of the following four components (A) to (D):

(A) at least one compound represented by general formula (I), (II), (III), (IV) or (V), or at least one polymer obtained by radical polymerization using at least one monomer represented by general formula (VI), (VII), (VIII), (IX) or (X):

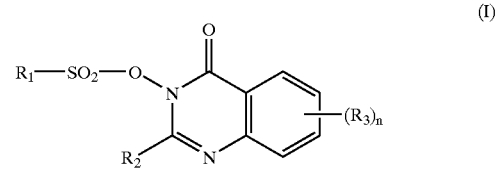

(I)

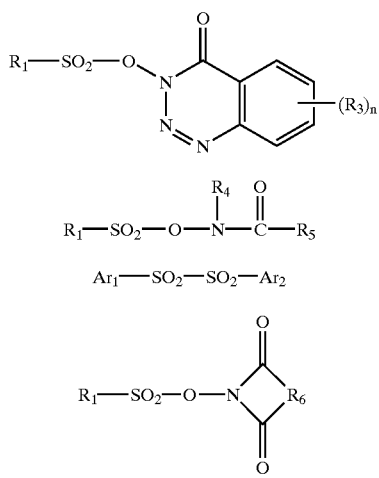

wherein $R_1$, $R_2$, $R_4$ and $R_5$ each represents a hydrocarbon group which has not more than 20 carbon atoms and which is optionally substituted; $R_3$ represents a halogen atom, or a hydrocarbon group which has not more than 10 carbon atoms and which is optionally substituted, or an alkoxy group which has not more than 10 carbon atoms and which is optionally substituted; $Ar_1$ and $Ar_2$ each represents an aryl group which has not more than 20 carbon atoms and which is optionally substituted; $R_6$ represents a divalent hydrocarbon group which has not more than 20 carbon atoms and which is optionally substituted; and n represents an integer from 0 to 4;

wherein $R_7$ represents a hydrogen atom, or a hydrocarbon group which has not more than 20 carbon atoms and which is optionally substituted; $R_8$ represents a single bond, or a divalent hydrocarbon group which has not more than 20 carbon atoms and which is optionally substituted; $R_9$, $R_{11}$ and $R_{12}$ each represents a hydrocarbon group which has not more than 20 carbon atoms and which is optionally substituted; $Ar_3$ and $Ar_4$ each represents an aryl group which has not more than 20 carbon atoms and which is optionally substituted; $R_{10}$ represents a halogen atom, or a hydrocarbon group which has not more than 10 carbon atoms and which is optionally substituted or an alkoxy group which has not more than 10 carbon atoms and which is optionally substituted; $R_{13}$ represents a divalent hydrocarbon group which has not more than 20 carbon atoms and which is optionally substituted; n represents an integer from 0 to 4; X represents a single bond, —CO—O— or —CO—$NR_{14}$—; $R_{14}$ represents a hydrogen atom, or a hydrocarbon group which has not more than 20 carbon atoms and which is optionally substituted;

(B) at least one cross-linking agent that is a phenol compound having not less than two hydroxymethyl groups or alkoxymethyl groups in the molecule and containing 3 to 5 benzene nuclei, and having a molecular weight of not more than 1,200;

(C) at least one infrared absorbing agent; and (D) at least one novolak resin, whose molecular weight is 800 to 200,000 as expressed in weight-average molecular weight and 400 to 60,000 as expressed in number-average molecular weight.

2. A planographic printing plate material according to claim 1, wherein the polymer is a copolymer obtained by radical polymerization using at least one of the monomers represented by the general formulas (VI) to (X) and at least on monomer other than those represented by the general formulas (VI) to (X).

3. A planographic printing plate material according to claim 2, wherein the content of monomer units represented by the general formulas (VI) to (X) in the copolymer is 5 to 90% by weight.

4. A planographic printing plate material according to claim 1, wherein the molecular weight of the polymer is not less than 2000 as expressed in weight-average molecular weight and is not less than 800 as expressed in number-average molecular weight.

5. A planographic printing plate material according to claim 1, wherein the content of the compound or the polymer in the image recording layer is 0.01 to 50% by weight based on the total weight of solid components in the image recording layer.

6. A planographic printing plate material according to claim 1, wherein the phenol compound has an alkoxymethyl group.

7. A planographic printing plate material according to claim 6, wherein the number of carbon atoms in the alkoxymethyl group is not more than 6.

8. A planographic printing plate material according to claim 1, wherein the content of the phenol compound in the image recording layer is 5 to 70% by weight based on the total weight of solid components in the image recording layer.

9. A planographic printing plate material according to claim 1, wherein the infrared absorbing agent is a dye or a pigment having maximum absorption at wavelengths of 760 to 1200 nm.

10. A planographic printing plate material according to claim 9, wherein the dye is a substance selected from the group consisting of cyanine dyes, squarylium dyes, pyrylium salts and nickel thiolate complexes.

11. A planographic printing plate material according to claim 9, wherein the pigment is carbon black.

12. A planographic printing plate material according to claim 9, wherein the particle size of the pigment is 0.01 to 10 µm.

13. A planographic printing plate material according to claim 9, wherein the content of the dye or the pigment in the image recording layer is 0.01 to 50% by weight based on the total weight of solid components in the image recording layer.

14. A planographic printing plate material according to claim 1, wherein the content of the novolak resin in the image recording layer is 5 to 90% by weight based on the total weight of solid components in the image recording layer.

* * * * *